(12) United States Patent
Sakamoto et al.

(10) Patent No.: US 8,997,344 B2
(45) Date of Patent: Apr. 7, 2015

(54) METHOD FOR MANUFACTURING INTERPOSER

(75) Inventors: Hajime Sakamoto, Ogaki (JP); Shuichi Kawano, Ogaki (JP); Daiki Komatsu, Ogaki (JP); Hiroshi Segawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 913 days.

(21) Appl. No.: 13/183,782

(22) Filed: Jul. 15, 2011

(65) Prior Publication Data

US 2011/0265324 A1    Nov. 3, 2011

Related U.S. Application Data

(62) Division of application No. 12/345,426, filed on Dec. 29, 2008, now Pat. No. 8,173,907.

(60) Provisional application No. 61/017,423, filed on Dec. 28, 2007, provisional application No. 61/038,932, filed on Mar. 24, 2008.

(51) Int. Cl.
*H01K 3/10* (2006.01)
*H01L 21/48* (2006.01)
(Continued)

(52) U.S. Cl.
CPC .......... *H01L 21/4857* (2013.01); *H01L 21/486* (2013.01); *H01L 23/5383* (2013.01); *H01L 23/5384* (2013.01); *H01L 23/5386* (2013.01); *H01L 24/16* (2013.01); *H01L 2224/13099* (2013.01); *H01L 2224/16237* (2013.01); *H01L 2924/01002* (2013.01); *H01L 2924/01004* (2013.01); *H01L 2924/01013* (2013.01); *H01L 2924/01022* (2013.01); *H01L 2924/01029* (2013.01); *H01L 2924/01033* (2013.01); *H01L 2924/01073* (2013.01); *H01L 2924/01078* (2013.01); *H01L 2924/01079* (2013.01);
(Continued)

(58) Field of Classification Search
CPC .............. H01L 21/4857; H01L 21/486; H01L 23/5383; H01L 23/5384; H01L 23/5386; H01L 24/16
USPC ............ 29/830, 831, 846, 852; 174/256, 262; 361/765
See application file for complete search history.

(56) References Cited

U.S. PATENT DOCUMENTS 5,072,520 A * 12/1991 Nelson ........................... 29/852
5,310,965 A    5/1994 Senba et al.
(Continued)

FOREIGN PATENT DOCUMENTS

JP    5-21635    1/1993
JP    2005-317705    11/2005
(Continued)

OTHER PUBLICATIONS

U.S. Appl. No. 13/183,742, filed Jul. 15, 2011, Sakamoto, et al.

*Primary Examiner* — Donghai D Nguyen
(74) *Attorney, Agent, or Firm* — Oblon, McClelland, Maier & Neustadt, L.L.P.

(57) ABSTRACT

A method for manufacturing an interposer including forming a first insulating layer comprising an inorganic material on a supporting substrate, forming a first wire in the first insulating layer, forming a second insulating layer on a first side of the first insulating layer, forming a second wire with a longer wire length and a greater thickness than the first wire on the second insulating layer, and removing the supporting substrate.

20 Claims, 27 Drawing Sheets

(51) Int. Cl.
*H01L 23/538* (2006.01)
*H01L 23/00* (2006.01)

(52) U.S. Cl.
CPC ............... *H01L2924/01082* (2013.01); *H01L 2924/04953* (2013.01); *H01L 2924/15174* (2013.01); *H01L 2924/15311* (2013.01); *H01L 2924/1532* (2013.01); *H01L 2924/19041* (2013.01); *H01L 2924/30107* (2013.01); *H01L 2924/3011* (2013.01); *H01L 2924/01005* (2013.01); *H01L 2924/01006* (2013.01); *H01L 2924/01019* (2013.01); *H01L 2924/01047* (2013.01); *H01L 2924/014* (2013.01); *H01L 2924/10253* (2013.01)

(56) References Cited

U.S. PATENT DOCUMENTS

| | | | |
|---|---|---|---|
| 5,461,545 A | 10/1995 | Leroy et al. | |
| 5,500,278 A | 3/1996 | Nagasaka | |
| 6,037,044 A | 3/2000 | Giri et al. | |
| 6,252,178 B1 | 6/2001 | Hashemi | |
| 6,376,052 B1 | 4/2002 | Asai et al. | |
| 6,662,442 B1 * | 12/2003 | Matsui et al. | 29/852 |
| 6,737,741 B2 | 5/2004 | Imasu et al. | |
| 7,973,246 B2 * | 7/2011 | Kuwajima | 29/846 |
| 2004/0212030 A1 | 10/2004 | Asai | |
| 2005/0155791 A1 | 7/2005 | Saiki | |
| 2006/0012048 A1 | 1/2006 | Murai et al. | |
| 2006/0254053 A1 | 11/2006 | Chanda et al. | |
| 2007/0023868 A1 | 2/2007 | Ho | |
| 2007/0080439 A1 | 4/2007 | Kikuchi et al. | |
| 2007/0128465 A1 | 6/2007 | Liu et al. | |
| 2007/0175025 A1 | 8/2007 | Tsukamoto et al. | |
| 2007/0184604 A1 | 8/2007 | Honda | |
| 2009/0173522 A1 | 7/2009 | Sakamoto et al. | |
| 2009/0175023 A1 | 7/2009 | Sakamoto et al. | |
| 2009/0231827 A1 | 9/2009 | Furutani et al. | |

FOREIGN PATENT DOCUMENTS

| | | |
|---|---|---|
| JP | 2006-019368 | 1/2006 |
| JP | 2006-019433 | 1/2006 |
| JP | 2006-294692 | 10/2006 |

* cited by examiner (a)

(b)

(c)

(a)

(b)

METHOD FOR MANUFACTURING INTERPOSER

CROSS-REFERENCE TO RELATED APPLICATIONS

The present application is a divisional of and claims the benefit of priority to U.S. application Ser. No. 12/345,426, filed Dec. 29, 2008, now U.S. Pat. No. 8,173,907, which is based upon and claims the benefits of priority to U.S. Application Nos. 61/017,423, filed Dec. 28, 2007, and 61/038,932, filed Mar. 24, 2008. The contents of those applications are incorporated herein by reference in their entirety.

BACKGROUND OF THE INVENTION

1. Field of the Invention

The present invention relates to an interposer and a method for manufacturing an interposer.

2. Discussion of the Background

A substrate called an interposer is used as an intermediate substrate on which multiple electronic components such as logic gates and memory are loaded. Electronic components loaded on the interposer are now being developed to have high density and surface-mounting methods such as BGA are used to draw multiple wires out of the electronic components.

In such an interposer for loading electronic components, wires are drawn from sites connecting one electronic component to another electronic component. Therefore, many wires are drawn within the interposer.

In addition, the amount of data handled by electronic components is increasing, and high-volume signal transmissions and fast signal transmissions need to be implemented in the interposer.

To implement high-volume signal transmissions and fast signal transmissions, it is necessary for the wire resistance between one electronic component and another electronic component to be weak.

Furthermore, in an interposer (such as one used in a substrate disposed in a mobile phone), because the space within which the interposer is disposed is small, it is necessary for the mounting height when electronic components are loaded to be small.

In Japanese Unexamined Patent Application Publication 2006-19433, an interposer with a penetrating through-hole in a supporting layer made of a silicon layer to load electronic components on both sides of a supporting substrate is described. In this interposer, wire layers laminated on one side of the supporting layer is provided, and the wire layer is formed with an insulating layer made of, for example, an organic material, a connecting electrode, and wiring in a predefined pattern. This interposer is an interposer with wiring formed in an organic insulating layer.

In addition, in Japanese Unexamined Patent Application Publication 2006-19433, an interposer with a method to load electronic components on both sides of a wire layer with wiring formed in the organic insulating layer is also described.

On the other hand, interposers with methods to form wiring in an insulating layer made of organic material using a wire-forming method (e.g., a damascene method) used in the semiconductor manufacturing process and load electronic components are also known.

The contents of the foregoing publication are incorporated herein by reference in their entirety.

SUMMARY OF THE INVENTION

According to one aspect of the present invention, an interposer includes a first insulating layer made of an inorganic material and having a first land, a second land and a first wiring electrically connecting the first land and the second land, and a second insulating layer formed over a first surface of the first insulating layer and having a second wiring, a second pad for loading a second electronic component over the second insulating layer and a first via conductor electrically connecting the second land and the second wire. The first wiring and the second wiring electrically connect the first land and the second pad. The first land and second land are positioned such that a first electronic component is mounted over a second surface of the first insulating layer on the opposite side of the first surface. The second wiring has a longer wiring length and a greater thickness than the first wiring.

According to another aspect of the present invention, an interposer includes a first insulating layer made of an inorganic material and having a first land, a second land, a first wiring electrically connecting the first land and the second land, and a second insulating layer formed on a first surface of the first insulating layer and having a second wiring, a first pad for loading a first electronic component, a first via conductor electrically connecting the first land and the first pad, a second via conductor electrically connecting the second land and the second wiring, and a second pad for loading a second electronic component in parallel with the first electronic component. The first pad and the second pad are electrically connected via the first wiring and the second wiring. The second wiring has a longer wiring length and a greater thickness than the first wiring.

According to yet another aspect of the present invention, a method for manufacturing an interposer includes forming a first insulating layer made of an inorganic material on a supporting substrate, forming a first wire in the first insulating layer, forming a second insulating layer on a first side of the first insulating layer, forming a second wire with a longer wire length and a greater thickness than the first wire on the second insulating layer and removing the supporting substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
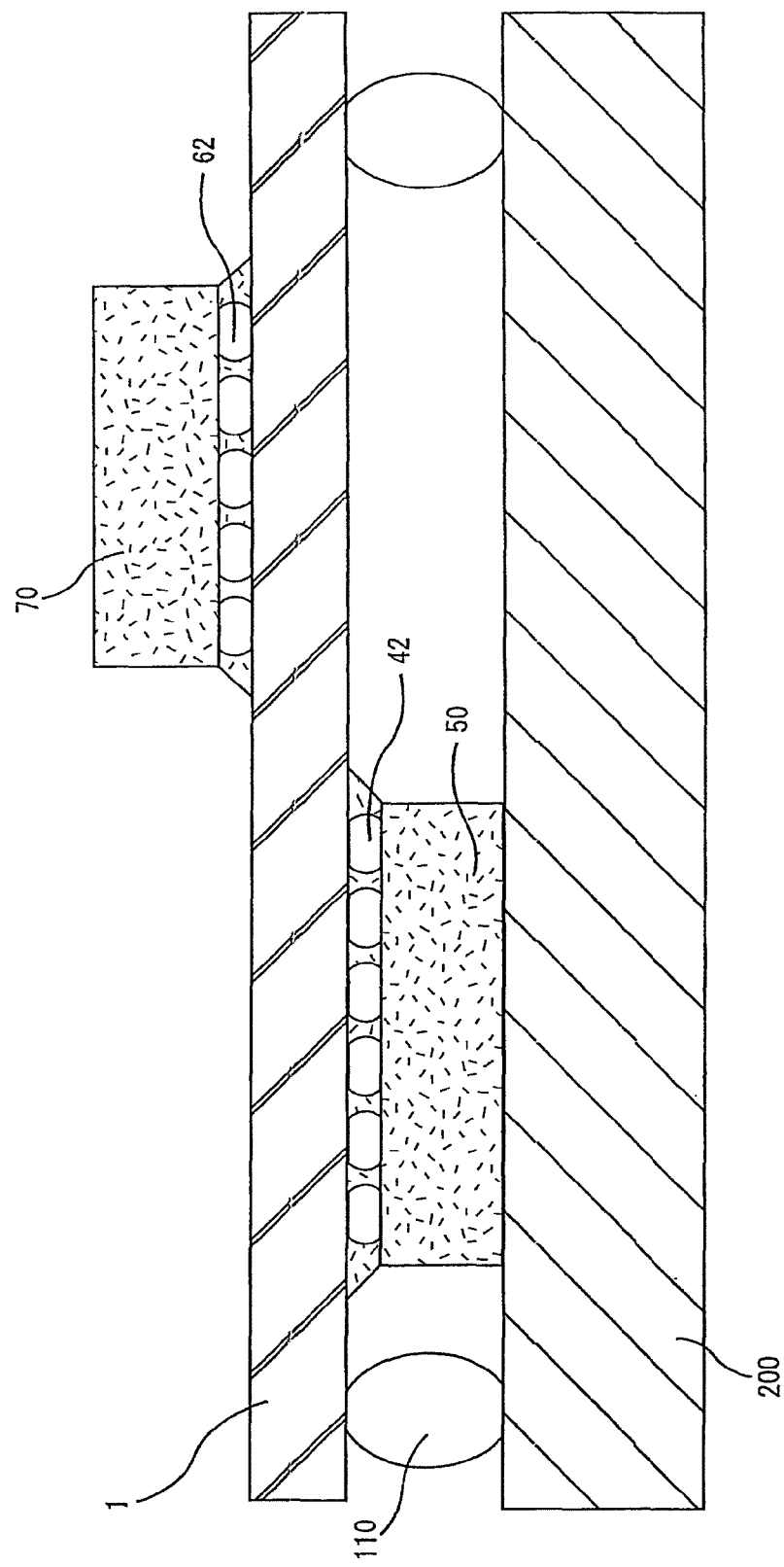
FIG. 1 is a cross-sectional view showing an exemplary use of an interposer according to an embodiment the of the present invention.

The embodiments will now be described with reference to the accompanying drawings, wherein like reference numerals designate corresponding or identical elements throughout the various drawings.

FIG. 1 is a cross-sectional view showing an exemplary use of an interposer according to an embodiment of the present invention. In an interposer 1 in this embodiment, as shown in FIG. 1, a first electronic component 50 and a second electronic component 70 (each electronic component includes a semiconductor device such as a logic gate and/or a memory) are loaded and further connected to a printed-wire board 200 (e.g. a mother board). An interposer according to an embodiment of the present invention has wiring to connect multiple electronic components to one other. The electronic components 50, 70 and the interposer 1 are connected via a bump 42 and a bump 62, and the interposer 1 and the printed-wire board 200 are connected via a bump 110. An interposer of the first embodiment according to the present invention and a method for manufacturing the interposer are described as follows. The first to seventh embodiments are embodiments of interposers according to the present invention and a method for manufacturing the interposers.

First Embodiment

Figure 2:
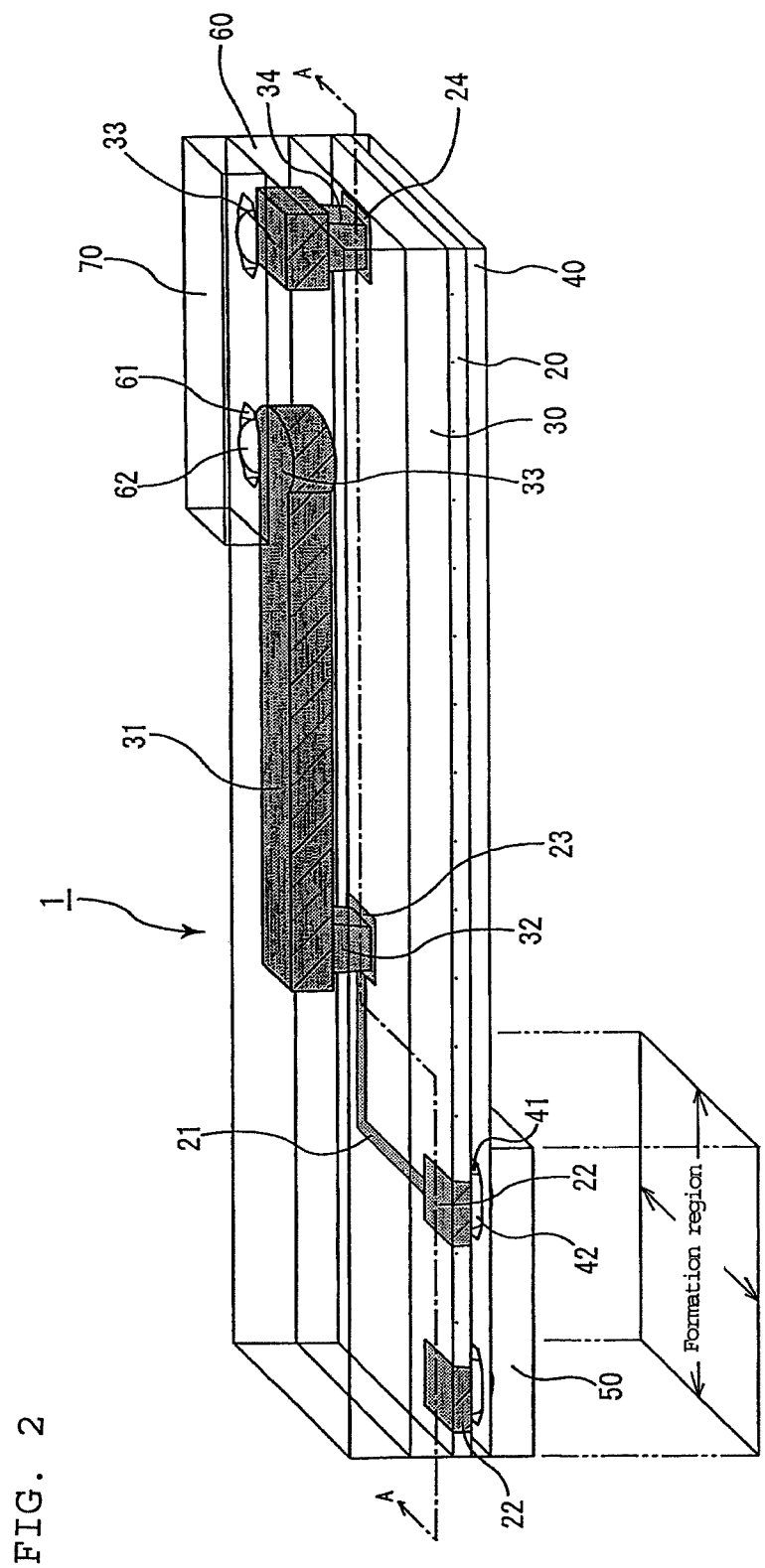
FIG. 2 is a perspective cross-sectional view showing part of the interposer of the first embodiment.

FIG. 2 is a perspective cross-sectional view showing part of the interposer of the first embodiment. In FIG. 2, to show the interior of the organic insulating layer and the protective film, the organic insulating layer and the protective film are illustrated as being transparent. In addition, to show the positional relationship between the first electronic component and the bump and the first pad (first land), the sealing resin of the first electronic component is illustrated as being transparent. The same applies to other perspective cross-sectional views in the present specification.

Figure 3:
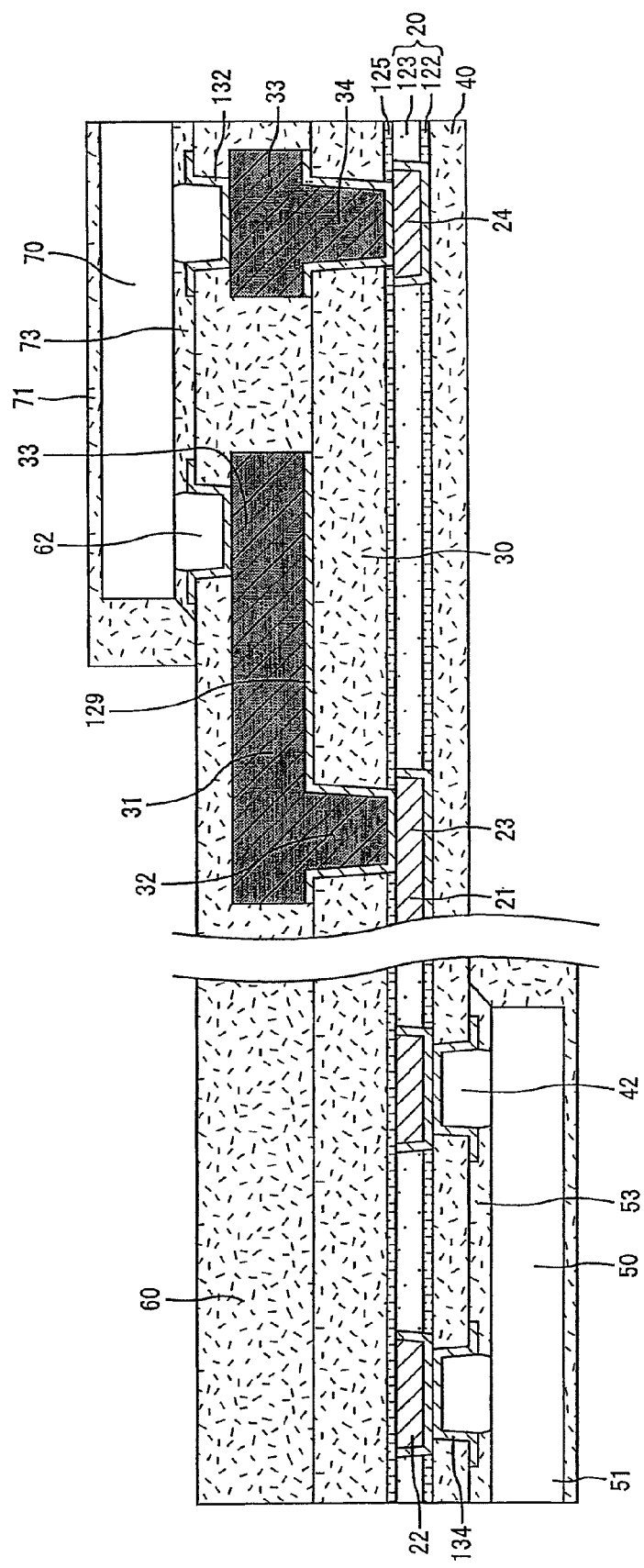
FIG. 3 is an A-A line cross-sectional view of the interposer shown in FIG. 2.

FIG. 3 is a A-A line cross-sectional view of the interposer shown in FIG. 2 showing a section cut so that the first wire and the second wire are included.

The interposer 1 of the present embodiment has a first insulating layer 20 made of an inorganic material, a first wire 21 formed within the first insulating layer, a second insulating layer 30 made of an organic material formed on a first side (upper side of FIG. 2) of a layer including structures such as the first insulating layer, a first protective film 40 provided on a second side (lower side of FIG. 2) of a layer including structures such as the first insulating layer, a second wire 31 formed on the second insulating layer, and a second protective film 60 provided on the second insulating layer. In FIGS. 2 and 3, it is shown that the electronic component 50 is loaded on the first protective film (lower side of FIG. 2) and the second electronic component 70 is loaded on the second protective film (upper side of FIG. 2). Referring to FIGS. 2 and 3, details of each of these elements are described as follows.

First, the first insulating layer and its surrounding structures are described. The first insulating layer 20 in the present embodiment is a layer made of an inorganic material such as $SiO_2$ (silicon dioxide) and $Si_3N_4$ (silicon nitride). An example of a specific layered structure is described in a method for manufacturing the interposer of the present embodiment.

The first land 22 is formed in one of concave portions formed in the first insulating layer 20. In the present embodiment, the second side of the first land 22 is connected to the bump 42 for loading the first electronic component 50. That is, the first land 22 also functions as the first pad for loading the first electronic component 50.

The second land 23 is formed in one of concave portions formed in the first insulating layer 20. The second land 23 is located below a first opening of the second insulating layer 30 to be described later, and the first side of the second land 23 is connected to a first via conductor 32 to be described later. In addition, the second land 23 is located outside the region where the first pad is formed (also referred as "the forming region of the first pad").

The first wire 21 is formed within the first insulating layer 20 to electrically connect the first pad (first land 22) and the second land 23. Because the second land 23 is located outside relative to the forming region of the first pad, by the first wire 21, the wire connected to the first electronic component 50 can be drawn outside of the forming region of the first pad (projection region of the first electronic component 50).

In the present embodiment, the first pad (first land 22), the second land 23, and the first wire 21 are formed using a damascene method, and the first pad (first land 22), the second land 23, and the first wire 21 are formed of copper plating and a seed layer under copper plating. An example of the structure of the seed layer is described in a method for manufacturing the interposer of the present embodiment. In addition, the L/S of the first wire 21 is made smaller than the L/S of a second wire 31 to be described later (L/S=wire width/distance between adjacent wires). The L/S of the first wire 21 is not particularly limited if wire distribution within the forming region of the first pad is possible. It is preferable that the L/S is about 1 μm/1 μm, but it may be finer than that. The thickness of this first wire 21 is made smaller than the thickness of the second wire to be described later. The thickness of the first wire 21 in the present embodiment is not particularly limited, but it is preferable that it is 2 μm or less. If the thickness of the first wire 21 is 2 μm or less, the wire can be made fine, the process can be made easier and cost reduced.

In addition, because the first pad (first land 22), the second land 23, and the first wire 21 are formed using a damascene method, a surface having the first insulating layer 20, the first pad (first land 22), the second land 23, and the first wire 21 is made flat.

In the present embodiment, the diameter of the second land 23 is made larger than the diameter of a first via conductor 32 to be described later. When comparing the diameter of the land and the diameter of the via conductor, the diameter of surfaces on which the land and the via conductor are in contact may be compared.

Next, the second insulating layer and its surrounding structures are described. The second insulating layer is made of an organic material and is formed on a first side of a layer including the first insulating layer 20, the first pad (first land 22), the second land 23, and the first wire 21. Within this second insulating layer 30, a first via conductor 32 is formed. Furthermore, on the second insulating layer 30, a second wire 31 and a second pad 33 are formed.

Figure 7:
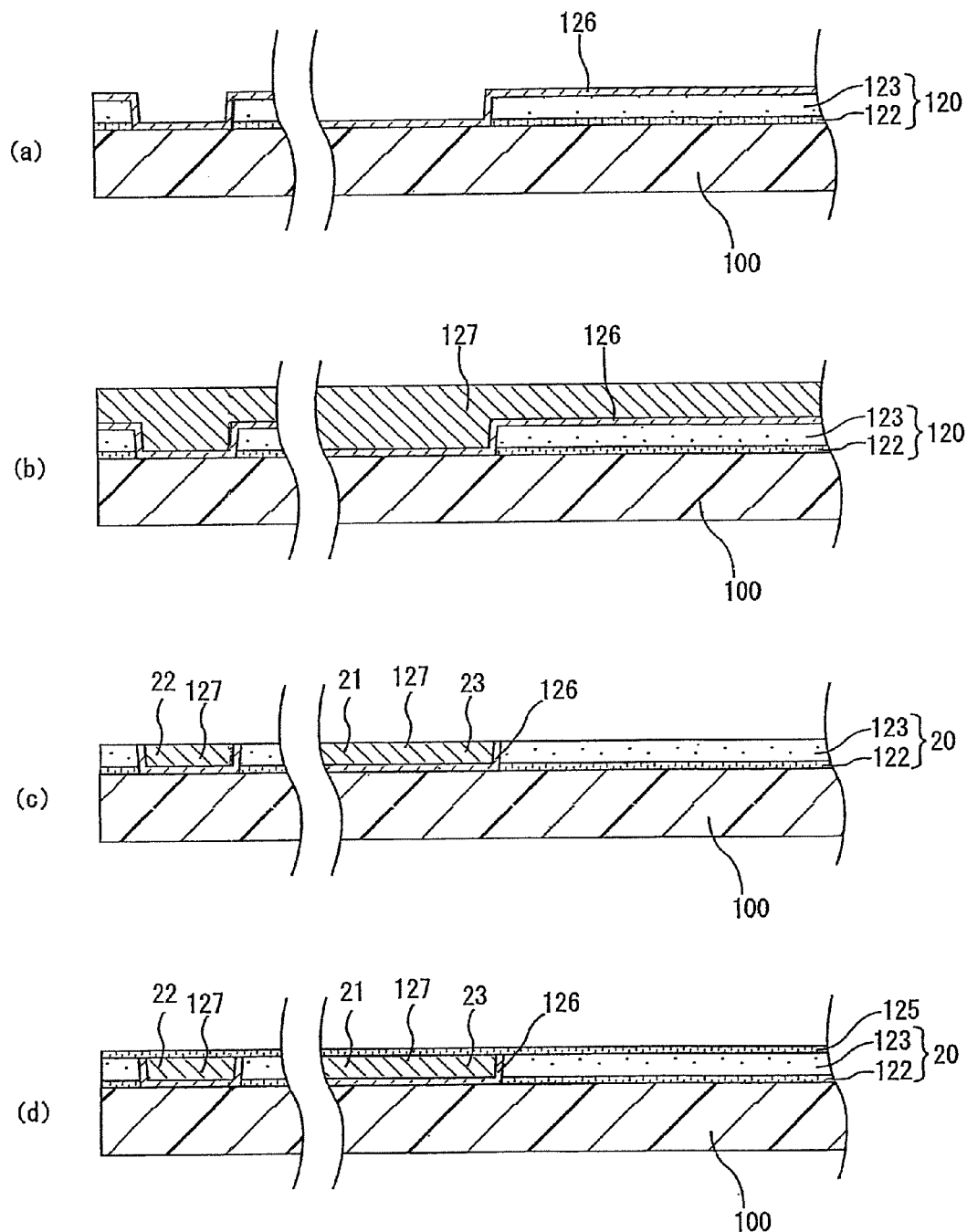
FIGS. 7 (*a*), 7 (*b*), 7 (*c*) and 7 (*d*) are cross-sectional views showing part of the manufacturing process of the interposer of the first embodiment.

The second insulating layer 30 has a first opening (see FIG. 7 (b)). In this first opening, the first via conductor 32 is formed, and the bottom of the first via conductor 32 is connected to the second land 23. The second wire 31 is formed on the second insulating layer 30, and the second wire 31 is electrically connected to the first via conductor 32. That is, the second wire 31 and the second land 23 are electrically connected via the first via conductor 32. The second pad 33 for loading the second electronic component 70 is formed on the second insulating layer 30. The second pad 33 is integrated with the second wire 31, and the second pad 33 and the second wire 31 are electrically connected.

The second insulating layer 30 is a layer made of, for example, a thermosetting resin, a photosensitive resin, a resin with a photosensitive group added to part of a thermosetting resin, a thermoplastic resin, or a combined resin containing these resins. It is preferable that it is composed of a photosensitive polyimide resin.

The first via conductor 32, the second wire 31, and the second pad 33 are formed of copper plating and a seed layer 129 (see FIG. 3) under the copper plating. An example of the structure of the seed layer is described in a method for manufacturing the interposer of the present embodiment.

In the present embodiment, the first via conductor 32, the second wire 31, and the second pad 33 are formed using a semiadditive method, and the L/S of the second wire 31 is made greater than the L/S of the first wire 21. The L/S of the second wire in the present embodiment is 3 μm/3 μm, but is not limited to this. The L/S of the second wire may be determined appropriately according to, for example, the number of second wires and the area of the region in which the second wire is formed.

This second wire 31 is made thicker than the first wire 21. The thickness of the second wire 31 in the present embodiment is not particularly limited, but it is preferable that it is greater than 2 μm and 30 μm or less. If the thickness of the second wire 31 is within this range, warpage of the interposer is suitably prevented. Moreover, the wire resistance of the second wire 31 can be reduced. Additionally, the thickness of the interposer will not increase. In addition, the thickness of the second wire means the average value of values obtained by measuring sections of ten arbitrary positions in the length direction by a scanning electron microscope. The same applies to the thickness of the first wire. In addition, the ratio of the thickness of the second wire relative to the thickness of the first wire is set greater than 1 and 15 or less. If the ratio the thickness the second wire relative to the thickness of the first wire is less than 1, the rigidity of the interposer is not ensured sufficiently, and warpage of the interposer may occur due to differences in the coefficients of thermal expansion between the semiconductor device and the interposer. On the other hand, if the ratio of the thickness of the second wire relative to the thickness of the first wire is greater than 15, given that wire width is the same, the aspect ratio of the second wire will be increased, and when the organic insulating layer is expanded and shrunk, for example, by heat cycle, the second wire will easily follow the expansion and shrinkage of the organic insulating layer and the adhesion of the second wire to the organic insulating layer may be reduced.

Next, the first protective film and the structures surrounding the first protective film are described. The first protective film 40 is an insulating film provided on a second side of a layer including the first insulating layer 20, the first pad (first land 22), the second land 23, and the first wire 21. The material of the first protective film 40 in the present embodiment is not particularly limited, but a resin is preferable for suitably protecting the wire layer inside. This resin includes resin similar to that of the second insulating layer. In addition, an example of the structure is described in a method for manufacturing the interposer of the present embodiment. The first protective film 40 has an aperture partly exposing the first pad (first land 22). That is, the outer edge of the first pad (first land 22) is coated with the first protective film. Then, in the aperture, the bump 42 made of solder is formed via a barrier metal layer 134. Through this bump 42, the first electronic component 50 is connected to the interposer.

Next, the second protective film and the structure surrounding the second protective film are described. The second protective film 60 is formed on the second insulating layer and the second wire. The second protective film 60 has an aperture 61 partly exposing the second pad 33. That is, as shown in FIG. 3, the outer edge of the second pad 33 is coated with the second protective film 60.

The material of the second protective film 60 is not particularly limited, but it is preferable that it is an organic material for adhesion to the second insulating layer. Then, in the aperture 61, the bump 62 made of solder is formed via a barrier metal layer 132 (see FIG. 3), and the second electronic component 70 is connected to the interposer via this bump 62.

In the interposer in the present embodiment shown in FIG. 2, from the first electronic component 50, wiring is connected in the order of the first pad (first land 22), the first wire 21, the second land 23, the first via conductor 32, the second wire 31, the second pad 33, and the second electronic component 70. That is, from the first pad (first land 22) on which the first electronic component 50 is loaded, wiring is distributed among other first lands using the first wire 21, and wiring is drawn to the second land 23 outside the forming region of the first pad (first land 22). Then, wiring is drawn up from the second land 23 to the second wire 31 on the second insulating layer via the first via conductor 32, and most of the connections between the first electronic component 50 and the second electronic component 70 are achieved via the second wire 31.

In the wiring between the first electronic component 50 and the second electronic component 70, the length of the second wire 31 is made longer than the length of the first wire 21. Thereby, the wire resistance of the wiring between two electronic components becomes smaller, and an interposer suitable for high-volume signal transmissions can be provided. Specifically, it is preferable that the ratio of the length of the second wire relative to the entire wire length connecting the first electronic component and the second electronic component is 60-90%. In addition, in the present embodiment, there is one of each of the first wire and the second wire in the wiring between the first electronic component and the second electronic component, but when the first electronic component and the second electronic component are electrically connected via multiple first wires or second wires, the total length of each wire may be compared to calculate the aforementioned percentage.

Figure 4:
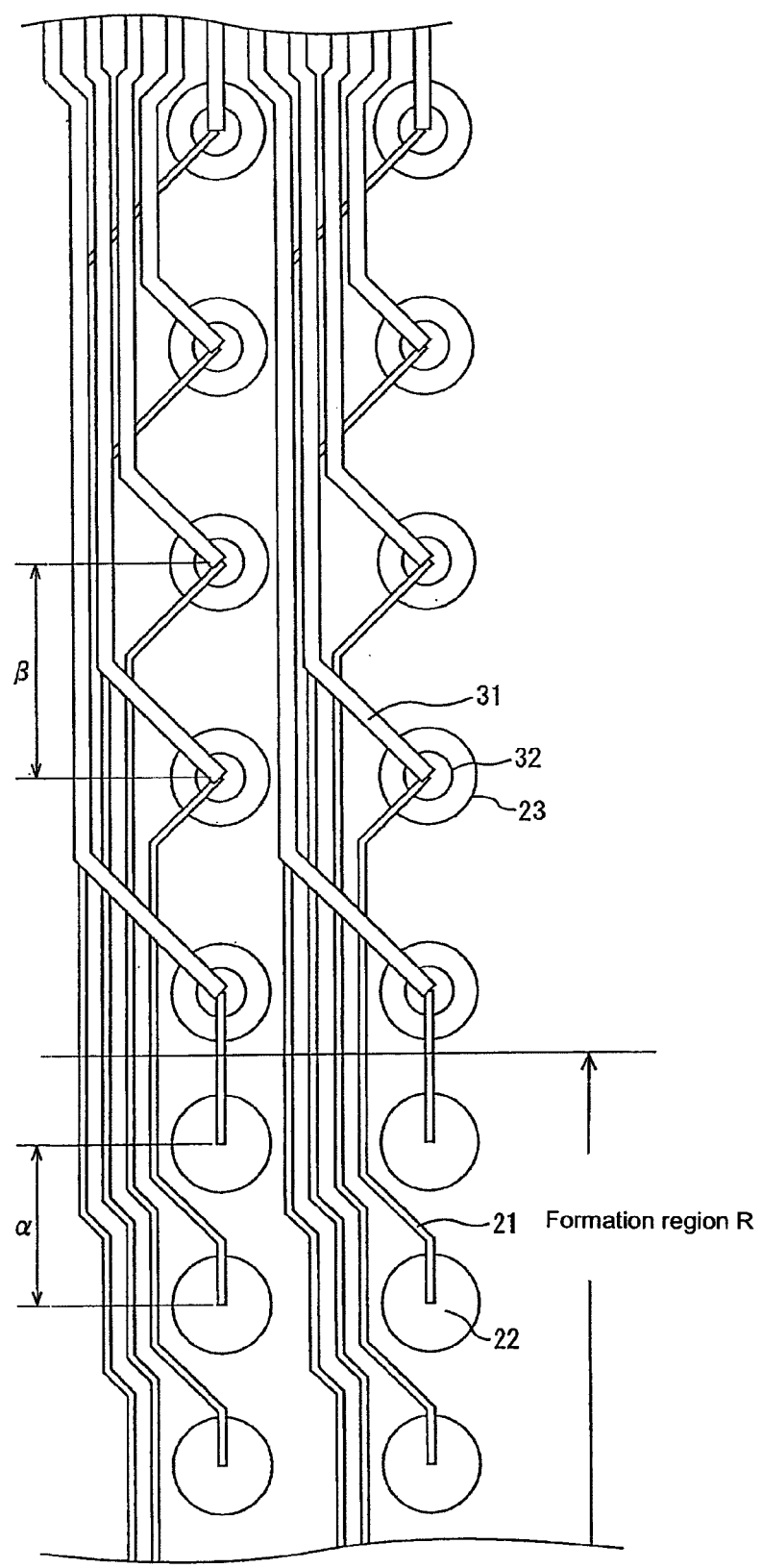
FIG. 4 is a top view showing part of an example of the interposer in the first embodiment.

The interposer in the present embodiment is described using a top view. FIG. 4 is a top view showing part of an example of the interposer of the first embodiment. In FIG. 4, each layer is illustrated as being transparent so that the wiring within the first insulating layer and the second insulating layer can be seen. FIG. 4 shows the forming region of the first pad and its surroundings, and there is the second electronic component outside the region shown in FIG. 4 (upper side).

In the first pad forming region (R), multiple first pads (first lands 22) are formed. That is, each round region shown in FIG. 4 is a site where an electrode of the first electronic component is connected. The first wire 21 is connected to each first pad (first land 22), and the first wire 21 is drawn outside the first pad forming region to be connected to the second land 23. On each second land 23, the first via conductor 32 is formed, and the second wire 31 is each connected to each first via conductor 32. The second wire 31 is integrated with the second pad (not shown) that exists outside (above) of the drawing. As shown in FIG. 4, in the present embodiment, the pitch β of the first via conductor 32 is relatively large compared to the pitch α of the first pad (first land 22).

In addition, in the present embodiment, the L/S of the first wire 21 is made 1 μm/1 μm and the L/S of the second wire 31 is made 3 μm/3 μm, while the width of the second wire 31 is made greater than that of the first wire 21.

The interposer in the present embodiment can load multiple electronic components of multiple types on both its surfaces. The numbers and types of the electronic components are not particularly limited, but on the interposer shown in the present embodiment, a logic gate on a second side and a memory on a first side are loaded. Then, the wiring between the logic gate on the second side and the memory on the first side is made up of the first wire and the second wire previously described.

Figure 5:
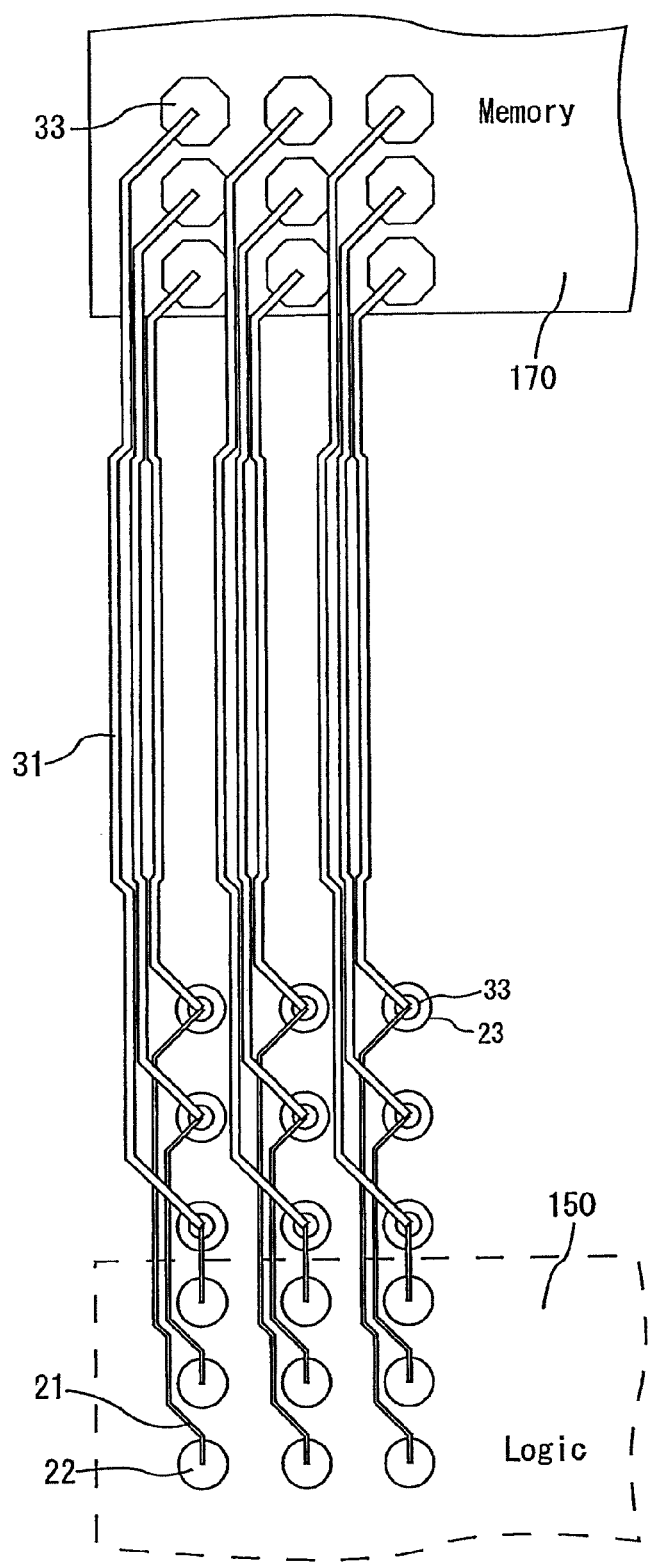
FIG. 5 is a top view showing an example in which an electronic component is loaded on the interposer of the first embodiment.

FIG. 5 is a top view enlarging the region between the logic and the memory. In FIG. 5, part of the wire drawn from the logic and the memory is illustratively shown.

In the region shown in FIG. 5, the first wire 21 is connected to the first pad (first land 22) on the side of the logic gate 150, and the first wire 21 is drawn to the second land 23 outside the forming region of the pad of the logic gate 150. The second wire 31 is connected to the second land 23 via the first via conductor 32, with the second wire 31 extending to the side of the memory 170 to be connected to the second pad 33 on the side of the memory 170, and via this second wire, the wiring on the side of the logic 150 and the wiring on the side of the memory 170 are connected.

As is clear from FIG. 5, the L/S of the first wire 21 is made smaller than the L/S of the second wire 31, and the length of the second wire 31 is made longer than that of the first wire 21. That is, most of the wiring between the logic gate 150 and the memory 170 is formed by the second wire 31.

A method for manufacturing the interposer of the present embodiment is described as follows with reference to drawings. In addition, in each drawing used for descriptions of this manufacturing method, wiring near the region where the first electronic component is loaded is shown on the left side of the drawings, and wiring near the region where the second electronic component is loaded is shown on the right side of the drawings. For regions not shown in each drawing, wiring can be formed in a similar manner.

Figure 6:
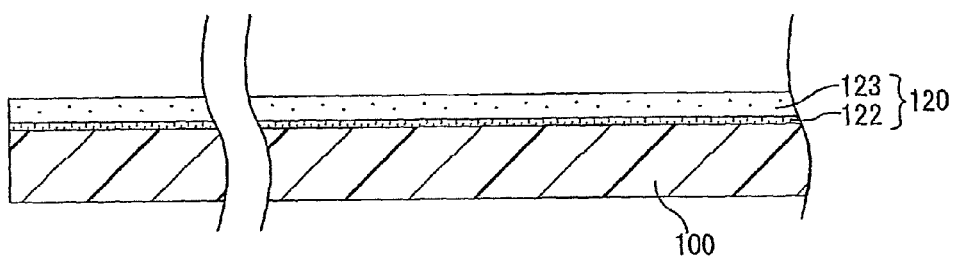
FIGS. 6 (*a*), 6 (*b*) and 6 (*c*) are cross-sectional views showing part of an manufacturing process of the interposer of the first embodiment.
Figure 6:
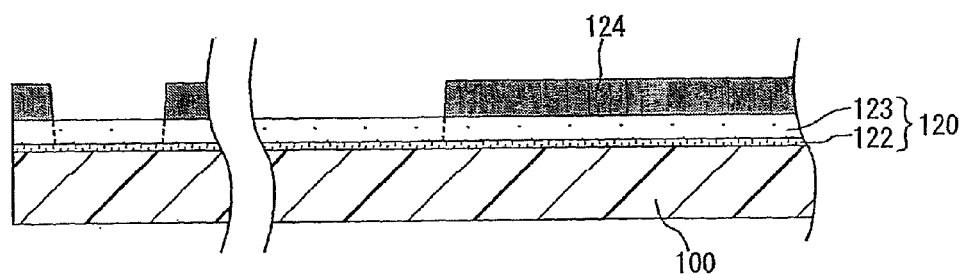
Figure 6:
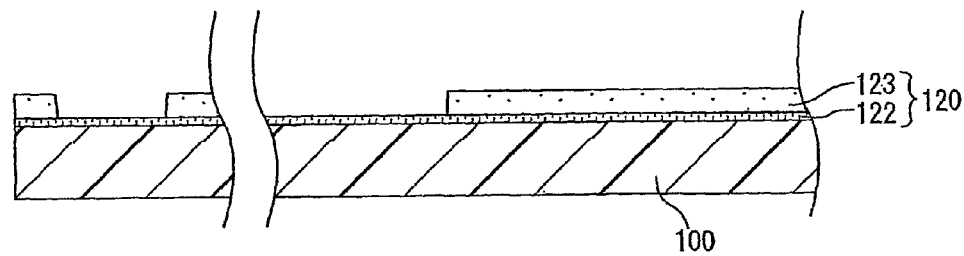

FIG. 6 (a), FIG. 6 (b) and FIG. 6 (c) as well as FIG. 7 (a), FIG. 7 (b), FIG. 7 (c) and FIG. 7 (d) are cross-sectional views showing parts of the manufacturing processes of the interposer of the first embodiment. First, as shown in FIG. 6 (a), a first insulating layer 120 ($Si_3N_4$ layer 122 and first $SiO_2$ layer 123) is formed on a supporting substrate 100. A silicon wafer is used as the supporting substrate 100, and on the top surface of the silicon wafer 100, the $Si_3N_4$ layer 122 and the $SiO_2$ layer 123 are each formed with a CVD (chemical vapor deposition) method.

Next, after coating, exposing and developing a resist material 124, the resist material 124 in a predetermined site for forming an aperture penetrating the $SiO_2$ layer 123 and the $Si_3N_4$ layer 122 underneath the $SiO_2$ layer 123 is removed. These processes are collectively shown in FIG. 6 (b).

Next, dry etching (reactive ion etching) is performed to etch the $SiO_2$ layer 123 and the $Si_3N_4$ layer 122 under the $SiO_2$ layer 123 in the part where the resist material 124 is not formed (see FIG. 6 (c)).

Next, as shown in FIG. 7 (a), a seed layer 126 is formed on the surface of the $SiO_2$ layer 123, the side of the aperture, and the surface of the silicon 100 exposed from the aperture, for example, by sputtering. In the present embodiment, the seed layer 126 is made of sputtered films of TaN, Ta, and Cu in that order from the bottom, but is not limited to this.

Next, as shown in FIG. 7 (b), electrolytic copper plating is performed with the seed layer as an electricity supply layer to form an electrolytic copper plating layer 127. Electrolytic copper plating may be performed using conventionally known methods.

Next, as shown in FIG. 7 (c), CMP (chemical mechanical polishing) is performed to eliminate parts of the electrolytic copper plating layer 127 and the seed layer 126 on the surface of the $SiO_2$ layer 123. In addition, CMP may be performed using methods or devices known in conventional damascene methods. Then, the electrolytic copper plating layer left after CMP is performed becomes the first pad 22 (first land), the second land 23, and the first wire 21. In addition, a side exposed on the surface herein becomes a first surface of a layer including the first insulating layer, the first pad (first land), the second land, and the first wire.

With the process described above, the first insulating layer, the first pad (first land), the second land, and the first wire can be formed. In addition, FIG. 7 (*c*) shows that the second land 23 and the first wire 21 are integrated. Next, as shown in FIG. 7 (*d*), an inorganic layer 125, for example, a $Si_3N_4$ layer, is formed on the surface, for example, by using CVD. This inorganic layer 125 is provided for the purpose of enhancing adhesion between the second insulating layer and the first insulating layer.

Figure 8:
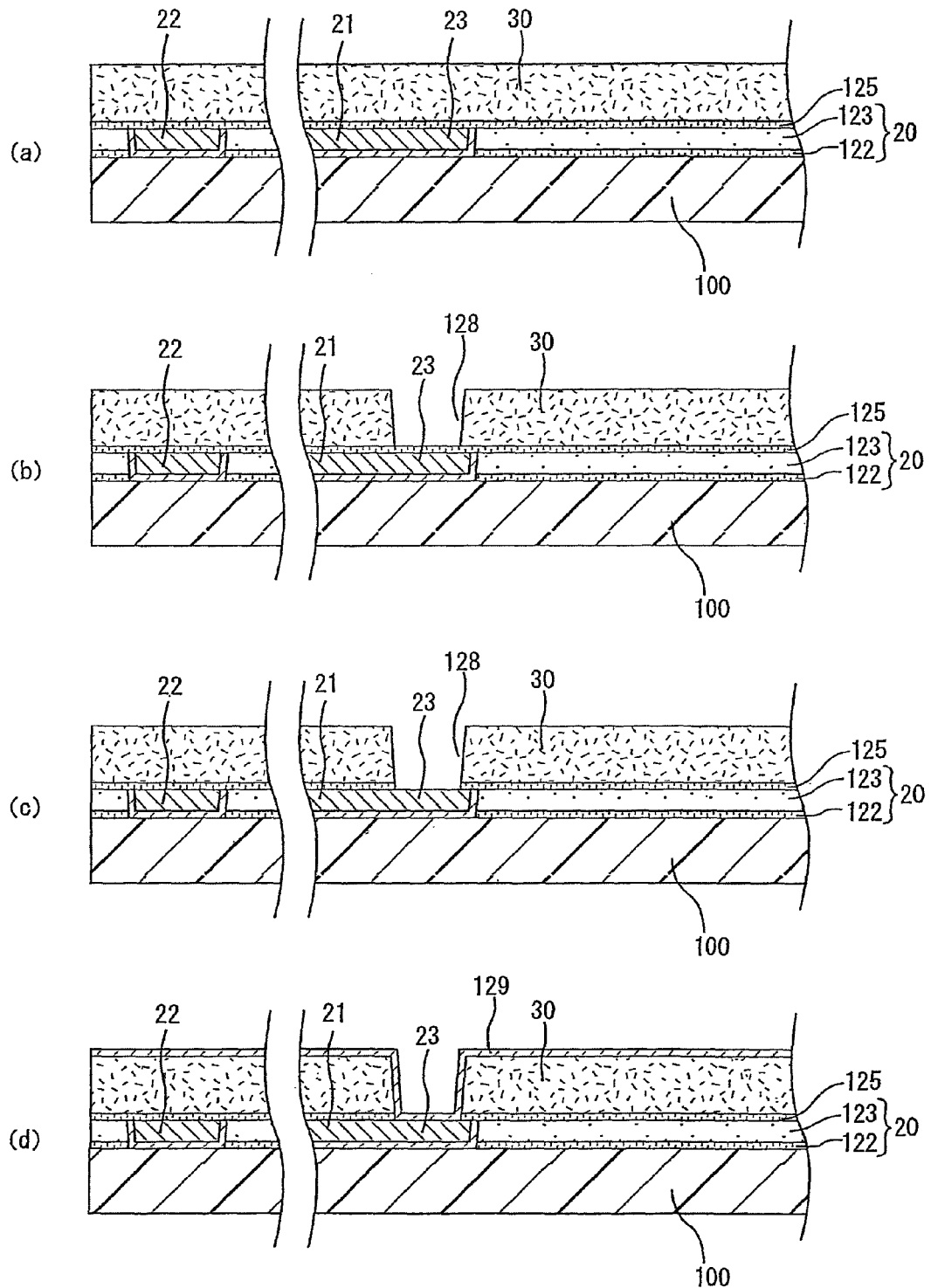
FIGS. 8 (*a*), 8 (*b*), 8 (*c*) and 8 (*d*) are cross-sectional views showing part of the manufacturing process of the interposer of the first embodiment.
Figure 9:
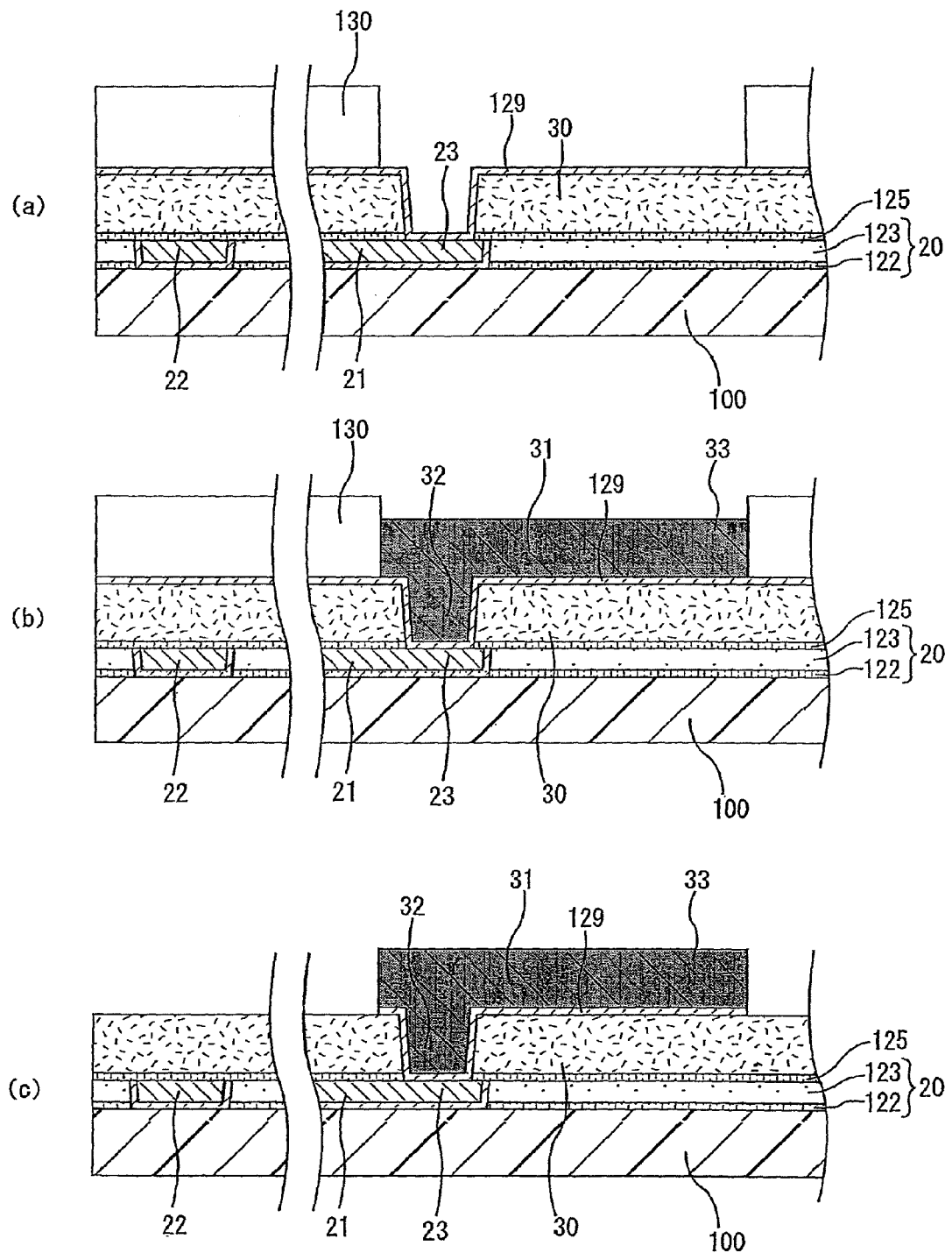
FIGS. 9 (a), 9 (b) and 9 (c) are cross-sectional views showing part of the manufacturing process of the interposer of the first embodiment.

FIG. 8 (*a*), FIG. 8 (*b*), FIG. 8 (*c*) and FIG. 8 (*d*) as well as FIG. 9 (*a*), FIG. 9 (*b*) and FIG. 9 (*c*) are cross-sectional views showing parts of the manufacturing processes of the interposer of the first embodiment. First, as shown in FIG. 8 (*a*), the second insulating layer 30 made of an organic insulating layer is formed on a first surface of a layer including the first insulating layer, the first pad (first land), the second land and the first wire, and an aperture (first opening 128) is formed as shown in FIG. 8 (*b*). As a method for forming the second insulating layer 30, a method of coating an uncured photosensitive polyimide resin using, for example, a roll coater, may be used.

As a method for forming the aperture, exposure development processing may be used. In the present embodiment, an aperture is formed above the second land 23, and this aperture becomes the first opening 128. Next, as shown in FIG. 8 (*c*), an inorganic layer exposed from the first opening is removed, for example, by reactive ion etching.

Next, as shown in FIG. 8 (*d*), a seed layer 129 is formed on the surface of the second insulating layer 30 (including the wall surface of the first opening 128) and the top surface of the second land 23 exposed from the first opening 23. The seed layer 129 is formed, for example, by sputtering and is made of Ti and Cu.

Next, as shown in FIG. 9 (*a*), a plating resist material 130 is formed, and by exposing via a mask and developing the plating resist material 130, the plating resist material 130 in the sites to form the second wire and the second pad is removed. As the plating resist material, a photosensitive dry film may be used.

As shown in FIG. 9 (*b*), electrolytic copper plating is performed with the seed layer 129 as an electricity supply layer to provide copper plating in the site where the plating resist material 130 has been removed. As a result, the first via conductor 32 is formed in the second insulating layer 30, and moreover, the second wire 31 and the second pad 33 are formed on the second insulating layer 30. In addition, FIG. 9 (*b*) shows that the first via conductor 32, the second wire 31, and the second pad 33 are integrated.

Next, as show in FIG. 9 (*c*), the remaining plating resist material is removed and the seed layer under the removed plating resist material is removed by etching. Etching methods include dry etching (reactive ion etching), which is preferable for preventing over-etching of the electrolytic copper plating forming the second wire.

With the processes described above, the second insulating layer, the first via conductor, the second wire, and the second pad can be formed.

Figure 10:
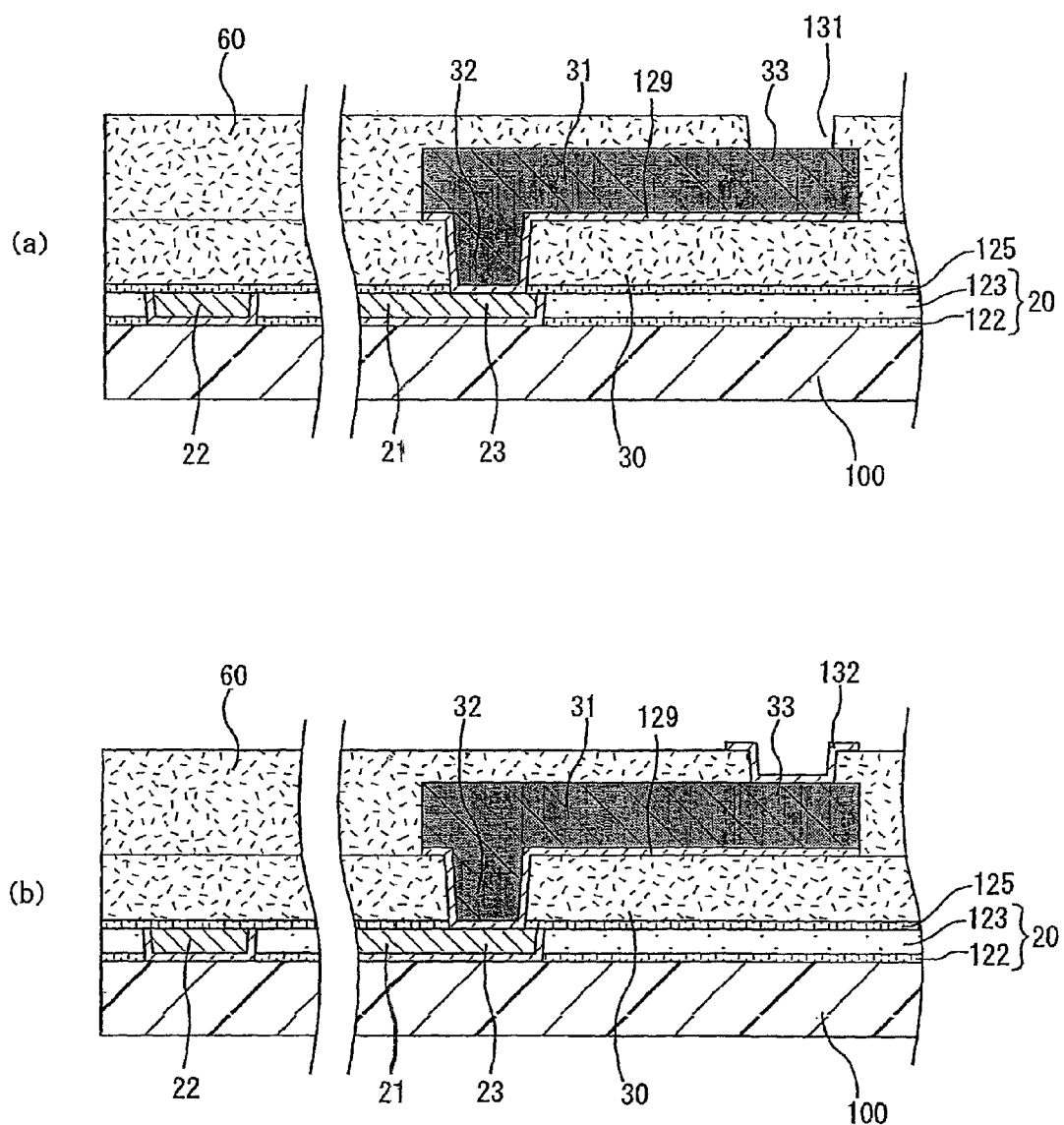
FIGS. 10 (a) and 10 (b) are cross-sectional views showing part of the manufacturing process of the interposer of the first embodiment.

FIG. 10 (*a*) and FIG. 10 (*b*) are cross-sectional views showing parts of the manufacturing processes of the interposer of the first embodiment. First, another organic insulating layer 60 is further formed on the second insulating layer 30. Then an aperture 131 is formed in a site on the newly formed organic insulating layer and above the second pad 33. This newly formed organic insulating layer becomes a second protective film 60. These processes are collectively shown in FIG. 10 (*a*). As a material of the organic insulating layer as the second protective film 60, the same material as the organic insulating layer used as the second insulating layer 30 may be used. In addition, for a method for forming the aperture 131, a similar method as the method for forming the first opening 128 may be used.

Next, as shown in FIG. 10 (*b*), a barrier metal layer 132 is formed in the aperture 131 provided in the second protective film 60. This barrier metal layer 132 may be formed by, for example, sputtering tantalum nitride and tantalum in that order. In addition, constituent materials and forming methods of the barrier metal are not particularly limited. With this process, the second protective film 60 can be formed. In addition, forming the second protective film and forming the barrier metal layer may be performed as needed. Then, although omitted in the drawing, Ni/Au plating is provided on the surface of the barrier metal 132 exposed from the aperture of the protective film. This is to ensure adhesion between the solder and the pad when solder bonding to be described is performed.

Figure 11:
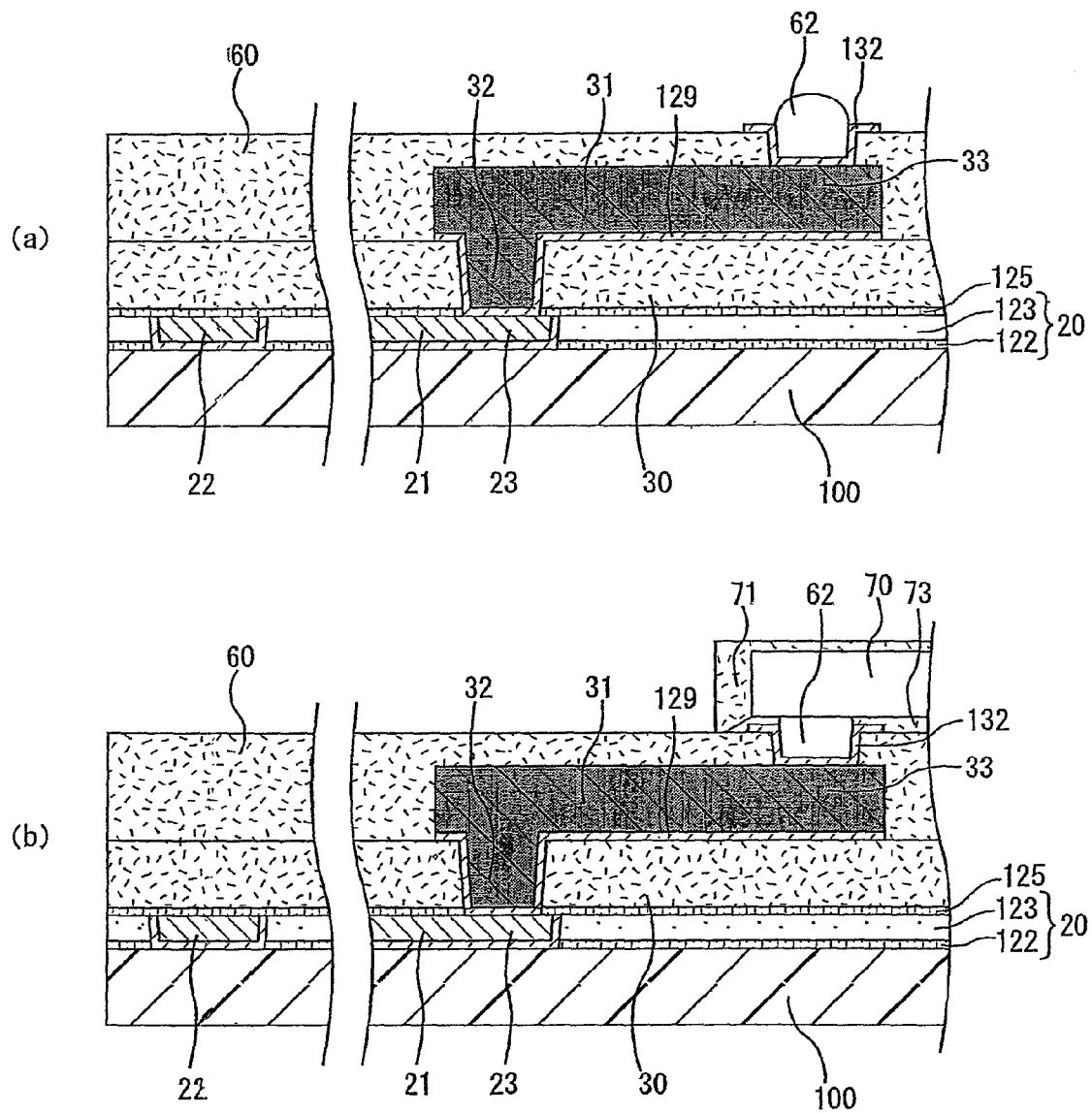
FIGS. 11 (a) and 11 (b) are cross-sectional views showing an example of a process for loading an electronic component on an interposer according to an embodiment of the present invention.

In the following, the process for loading the second electronic component on the interposer is described. FIG. 11 (*a*) and FIG. 11 (*b*) are cross-sectional views showing an exemplary process for loading the electronic component on the interposer. First, as shown in FIG. 11 (*a*), a bump 62 made of solder is formed on the pad 33.

Next, the second electronic component 70 is flip-chip mounted on the interposer via this bump 62. Then, an underfill resin 73 is filled between the electronic component 70 and the interposer and cured. Next, the circumference of the loaded electronic component 50 is sealed with a sealing resin 71. By sealing the circumference of the loaded second electronic component 70 with the sealing resin 71, loading of the second electronic component 70 can be completed. These processes are collectively shown in FIG. 11 (*b*). In addition, resin usually used for sealing an electronic component may be used as the underfill resin and sealing resin.

Figure 12:
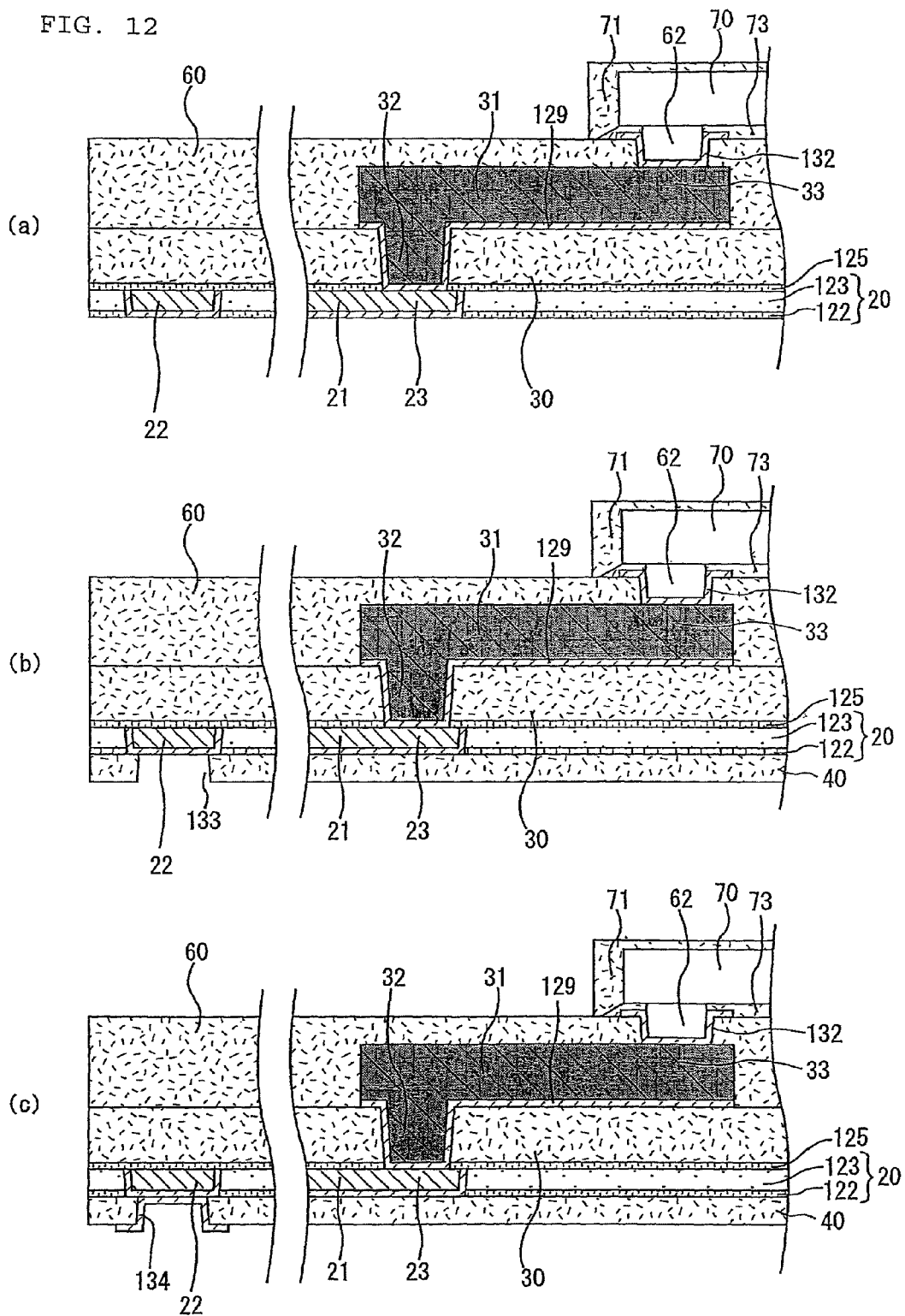
FIGS. 12 (a), 12 (b) and 12 (c) are cross-sectional views showing part of the manufacturing process of the interposer of the first embodiment.

The process for forming a first protective film on a second side is hereinafter described. FIG. 12 (*a*), FIG. 12 (*b*) and FIG. 12 (*c*) are cross-sectional views showing parts of the manufacturing processes of the interposer of the first embodiment. First, as shown in FIG. 12 (*a*), the supporting substrate 100 is removed. Methods for removing the supporting substrate 100 are not particularly limited, but it may be performed by grinding and etching. First, a second side of the supporting substrate made of a silicon wafer (side where the surface of the supporting substrate is exposed) is ground using a grinding device to reduce the thickness of the supporting substrate. The grinded amount is not specified, but it is preferable that it is ground until the thickness of the supporting substrate becomes approximately 100 μm. As for the grinding device, any grinding device suitable for grinding a silicon wafer may be used.

The supporting substrate (silicon wafer) thinned by grinding is etched using an etching solution such as potassium hydroxide and is completely removed. As an etching solution for etching, it is not particularly limited if it may used for etching a silicon wafer. For example, a potassium hydroxide solution may be used. The device for etching is not particularly limited, but a device for wet-etching a silicon wafer may be suitably used. Here, in FIG. 6 (*a*), before forming the inorganic insulating layer 120 on the supporting substrate 100 (silicon wafer), a release layer may be formed on the surface of the supporting substrate 100. The material of this release layer may be a metal such as Cu and Ni or it may be resin. In that case, when removing the supporting substrate 100, the interposer and the supporting substrate can be separated easily via the release layer. The technique is not particularly limited, but when the release layer is a metal, etching may be used. When the release layer is a resin, alkali dissolution may be used. In that case, the supporting substrate 100 (silicon wafer) can be used again.

As shown in FIG. 12 (*b*), a first protective film 40 is formed on the second side in a manner similar to the second protective film 60, and an aperture 133 is formed in the portion under the first pad (first land 22) to expose the first pad (first land 22) from the second side. As a method for forming the aperture 133, a method similar to the method used when forming the aperture in the second protective film can be used.

Next, as shown in FIG. 12 (*c*), a barrier metal layer 134 is formed in the aperture 133 provided under the first pad (first land 22). Constituent materials and the forming method of the barrier metal 134 may be the same as the constituent materials and the forming method of the barrier metal 132 provided under the second pad 33.

Figure 13:
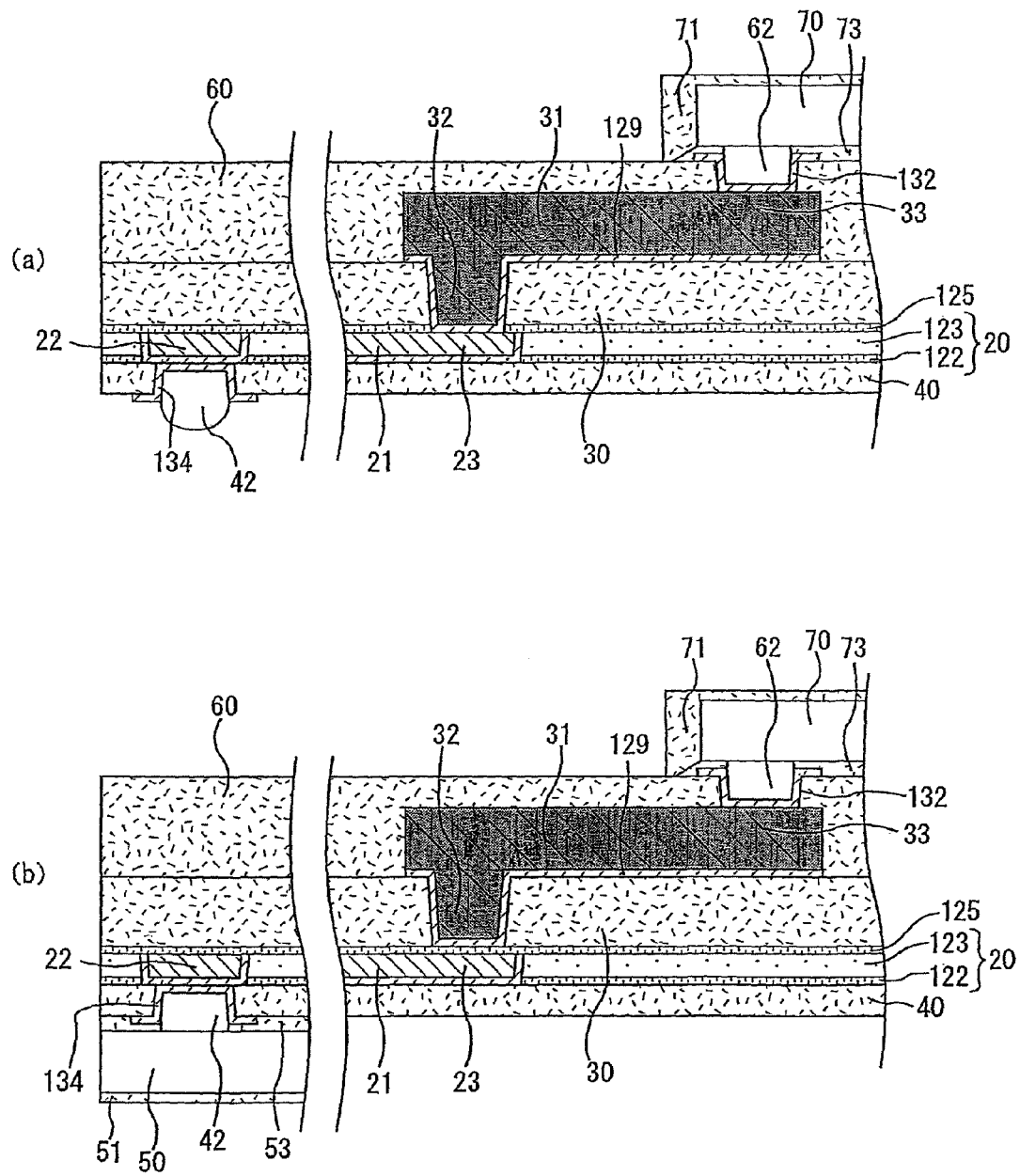
FIGS. 13 (a) and 13 (b) are cross-sectional views showing an example of a process for loading an electronic component on an interposer according to an embodiment of the present invention.

The process for loading the first electronic component on the interposer is hereinafter described. FIG. 13 (*a*) and FIG. 13 (*b*) are cross-sectional views showing an exemplary process for loading the electronic component on the interposer. First, as shown in FIG. 13 (*a*), a bump 42 made of solder is formed on a pad.

Next, the first electronic component 50 is flip-chip mounted on the interposer via this bump 42. Then, an underfill resin 53 is filled between the electronic component 50 and the interposer and cured. Next, the circumference of the loaded electronic component 50 is sealed with a sealing resin 51. In this manner, by sealing the circumference of the loaded first electronic component 50 with the sealing resin 51, loading of the first electronic component 50 can be completed. These processes are collectively shown in FIG. 13 (*b*). With the processes described above, an interposer on which the first electronic component 50 and the second electronic component 70 are loaded can be manufactured.

In addition, when an interposer is formed on a silicon wafer using the silicon wafer as a supporting substrate, by using a silicon wafer that is sufficiently large for the dimensions of an interposer, multiple interposers can be formed on one silicon wafer. When multiple interposers are formed on one silicon wafer, at proper timing such as after the process for loading the second electronic component or after the process for loading the first electronic component, by cutting the silicon wafer into individual pieces, for example, by dicing, they can be divided per interposer. The interposer can thereby be efficiently manufactured.

Advantages of the interposer of the present embodiment and the method for manufacturing the interposer are described below.

(1) The interposer of the present embodiment has a first pad for loading a first electronic component on a second side of the first insulating layer, as well as a second pad for loading a second electronic component on the second insulating layer. Therefore, the electronic components in the electrically connected state can be loaded on both the first and second sides of the first insulating layer.

(2) Because the interposer of the present embodiment does not have a supporting substrate and wires are distributed with a small number of layers, it is an interposer with thin thickness. Therefore, the mounting height when electronic components are loaded can be lowered.

(3) In the first insulating layer made of an inorganic layer, the first pad (first land), the second land and the first wire are formed with the first wire electrically connecting the first pad (first land) and the second land. Because the first wire is a wire that can implement minute wiring, fine wiring that is invariably required between connecting terminals of the first electronic component can be implemented with the first wire.

(4) The second land is located outside the forming region of the first pad. Therefore, from the first pad (first land) electrically connected to an electrode of the first electronic component, the first wire, which is a minute wire, is distributed through the first land, and the first wire can be drawn outside the forming region of the first pad (projection region of the first electronic component) to be connected to the second land. That is, the wire can be drawn from a region requiring fine wiring to a region with less need for fine wiring.

(5) Because the wiring is distributed using the fine wiring formed in the first insulating layer, the number of layers required for distributing wires can be reduced to achieve fanning out. Therefore, it is possible to make the electronic components finer and with a smaller number of layers.

(6) The second wire has a longer wire length and a greater thickness than the first wire and the second wire has lower wire resistance per unit length than the first wire. Because the wire connecting the first pad (first land) and the second pad is connected mainly by the second wire, which is a wire with low wire resistance per unit length, the wire resistance of the wiring between two electronic components is effectively reduced, thus providing an interposer suitable for high-volume signal transmissions.

(7) Because the first pad (first land), the second land, and the first wire are formed using a damascene method, the surface including the first insulating layer, the first pad (first land), the second land, and the first wire is made flat. Therefore, in the interposer, for example, a second insulating layer, a first via conductor, and a second wire can be formed precisely on that surface and its flatness can be high.

(8) A first protective film having an aperture above the first pad is provided, and a second protective film having an aperture above the second pad is provided. Therefore, the wire layer inside can be suitably protected.

(9) Because both the first insulating layer and the second insulating layer are provided as only one layer each, the thickness of the interposer as a whole becomes thin, and when electronic components are loaded, a substrate with a low mounting height can be achieved. From a perspective of shorting the wire length between the electronic components as much as possible, wire resistance can be reduced.

(10) Because the inorganic film is provided between the first insulating layer and the second insulating layer, adhesion between the first insulating layer and the second insulating layer can be improved.

(11) In the method for manufacturing the interposer of the present embodiment, the process for forming the first wire using a damascene method and the process for forming the second wire using a semiadditive method are performed. Thereby, the first wire that implements minute distribution is formed precisely, and the second wire with a longer wire length and a greater thickness (lower wire resistance per unit length) than the first wire can be formed simply and at low cost. Thus, according to the method for manufacturing the interposer of the present embodiment, for example, in the wires between the first electronic component and the second electronic component, minute distribution that is invariably required between connecting terminals of the first electronic component is implemented with the first wire, and most of the wiring between the first electronic component and the second electronic component is made up of the second wire, thereby making it possible to manufacture an interposer suitable for high-volume signal transmissions with effectively reduced wire resistance.

(12) In the method for manufacturing the interposer of the present embodiment, the supporting substrate is removed and an aperture is further formed on the second side of the first insulating layer. Therefore, it is possible to lower the mounting height and manufacture an interposer in which the electronic components can be loaded in the electrically connected state on both the first and second sides of the first insulating layer.

Second Embodiment

Figure 14:
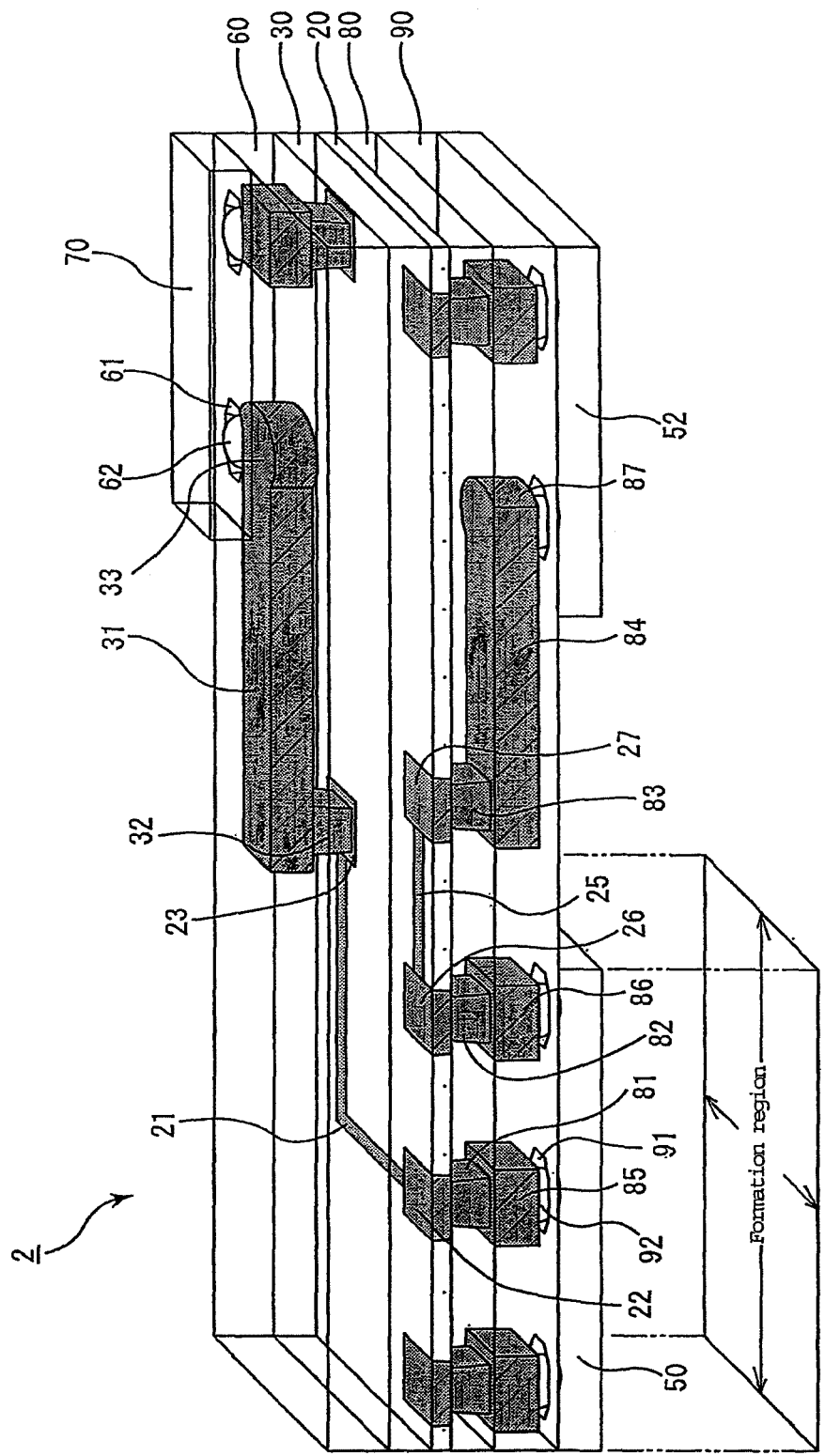
FIG. 14 is a perspective cross-sectional view showing part of an interposer according to the second embodiment of the present invention.

An interposer according to the second embodiment of the present invention is described as follows. FIG. 14 is a perspective cross-sectional view showing part of an example of the interposer of the second embodiment. In addition to the interposer of the first embodiment, the interposer 2 of the present embodiment has a third insulating layer 80 provided on a second side of the first insulating layer, and a first protective film 90 provided on the third insulating layer 80 (lower side of FIG. 14). In FIG. 14, it is shown that the first electronic component 50 and the third electronic component 52 are loaded on the first protective film 90. In addition, the pattern of connection between the first land 22 and the first electronic component 50 is different from that of the first embodiment.

In the interposer 2 of the present embodiment, in addition to the first land 22 and the second land 23, a third land 26 and a fourth land 27 are formed on the first insulating layer 20, and the third land 26 and the fourth land 27 are electrically connected by a third wire 25. These are formed using a damascene method. Because the third land 26 is located inside and the fourth land 27 is located outside in relation to the forming region of the pad connected to the first electronic component 50 (projection region of the first electronic component), the wire connected to the first electronic component 50 can be drawn outside the projection region of the first electronic component through the third wire 25.

On the second side of a layer including the first insulating layer 20, the first land 22, the second land 23 and the first wire 21, the third insulating layer 80 is formed. Within this third insulating layer, a second via conductor 81, a third via conductor 82 and a fourth via conductor 83 are formed. Furthermore, on the third insulating layer 80 (lower side of FIG. 14), a fourth wire 84, a first pad 85, a third pad 86 and a fourth pad 87 are formed.

The third insulating layer has a second opening, a third opening and a fourth opening, and the second via conductor 81, the third via conductor 82 and the fourth via conductor 83 are each formed in each opening, respectively. The bottoms of the second via conductor 81, the third via conductor 82 and the fourth via conductor 83 (upper side of FIG. 14) are connected to the first land 22, the third land 26 and the fourth land 27, respectively.

On the third insulating layer 80, the first pad 85 and the third pad 86 are formed and connected to the top surfaces (lower side of FIG. 14) of the second via conductor 81 and the third via conductor 83, respectively. These first pad 85 and third pad 86 are pads for loading the first electronic component 50, and in the present embodiment, the first pad and the first land are separated.

The fourth wire 84 is formed on the third insulating layer 80, and the fourth wire 84 is electrically connected to the fourth via conductor 83. That is, the fourth wire 84 is connected to the third wire 25 via the fourth via conductor 83. The fourth pad 87 for loading the third electronic component 52 is formed on the third insulating layer 80. The fourth pad 87 is integrated with the fourth wire 84, and the fourth pad 87 and the fourth wire 84 are electrically connected.

The first protective film 90 is formed on the third insulating layer 80 and the fourth wire 84. The structure of the first protective film is a similar to that of the second protective film 60 provided on the second insulating layer 30. The first protective film 90 has an aperture 91 partly exposing each of the first pad 85, the third pad 86 and the fourth pad 87. That is, the outer edge of each pad is protected by the first protective film.

Figure 20:
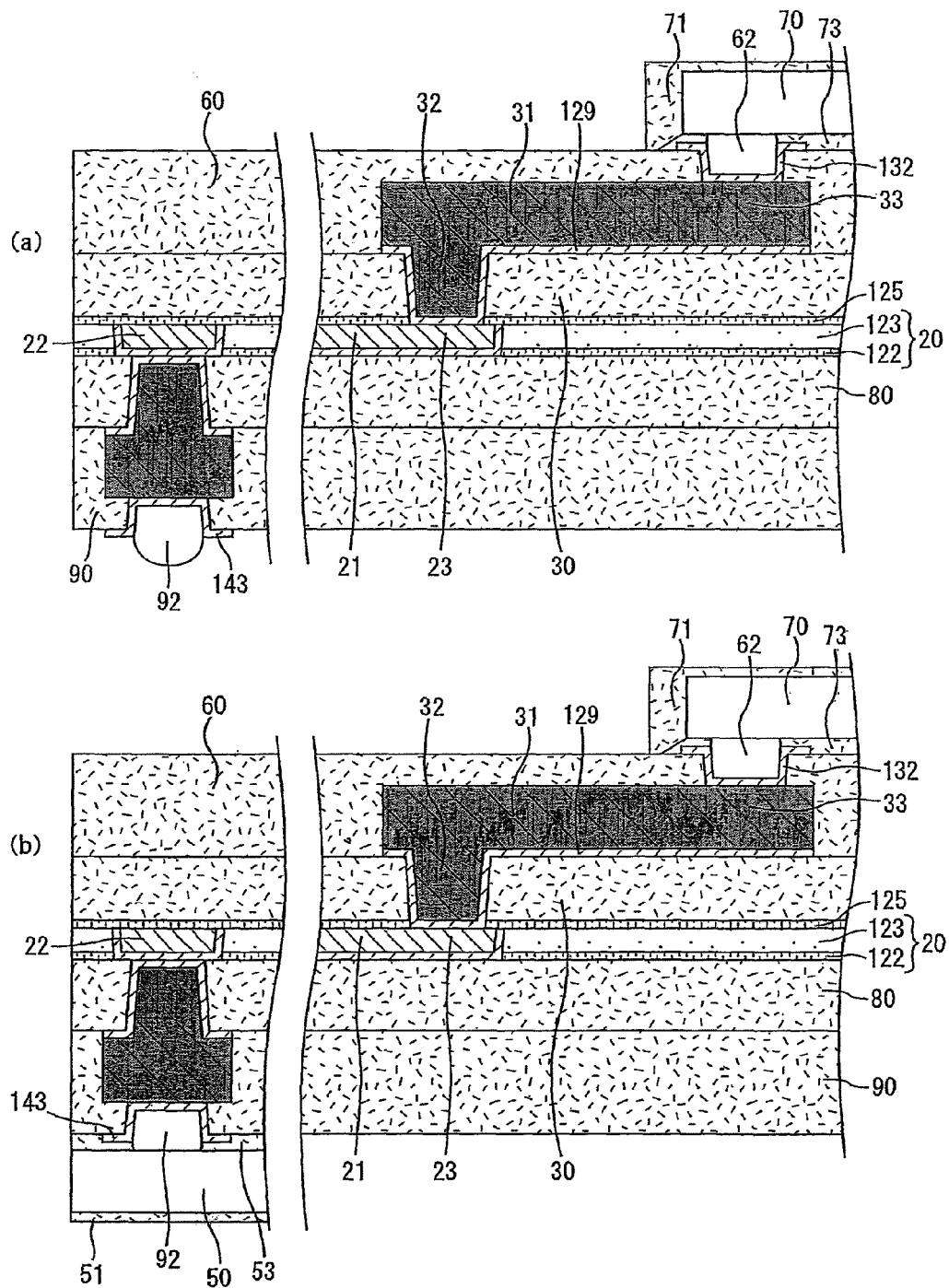
FIGS. 20 (a) and 20 (b) are cross-sectional views showing an example of a process for loading an electronic component on an interposer according to an embodiment of the present invention.

Then, in the aperture 91, a bump 92 made of solder is formed via a barrier metal layer 143 (see FIG. 20 (b)), and the electronic component is connected to the interposer via this bump 92.

In the interposer of the present embodiment shown in FIG. 14, from the first electronic component 50 toward the third electronic component 52, wiring is connected in the order of the third pad 86, the third via conductor 82, the third land 26, the third wire 25, the fourth land 27, the fourth via conductor 83, the fourth wire 84, the fourth pad 87 and the third electronic component 52. That is, from the third land 26 connected to the third pad 86 on which the first electronic component 50 is loaded, wiring is distributed using the third wire 25, and wiring is drawn to the fourth land 27 outside the forming region of the pad connected to the first electronic component 50 (projection region of the first electronic component). Then, wiring is drawn up from the fourth land 27 to the fourth wire 84 on the third insulating layer via the fourth via conductor 83, and most of the connections between the first electronic component 50 and the third electronic component 52 are achieved via the fourth wire 84.

In addition, the wiring between the first electronic component 50 and the second electronic component 52 is a similar to that in the first embodiment except that the site in which the first land and the first pad are structured with the same member in the first embodiment is divided into the first pad 85, the second via conductor 81 and the first land 22 and these are electrically connected.

A method for manufacturing the interposer of the present embodiment is described using drawings as follows. In the manufacturing method of the present embodiment, the second electronic component is loaded as shown in FIG. 11 (b) in a manner similar to the method for manufacturing the interposer of the first embodiment except that the third land, the fourth land and the third wire are formed in a manner similar to that of the first land and the first wire. An aperture is then formed on the second side, and forming of, for example, the third insulating layer and the fourth wire on the second surface are carried out. Moreover, loading of the first electronic component and loading of the third electronic component are performed. Hereinafter, each of these processes are described.

Figure 15:
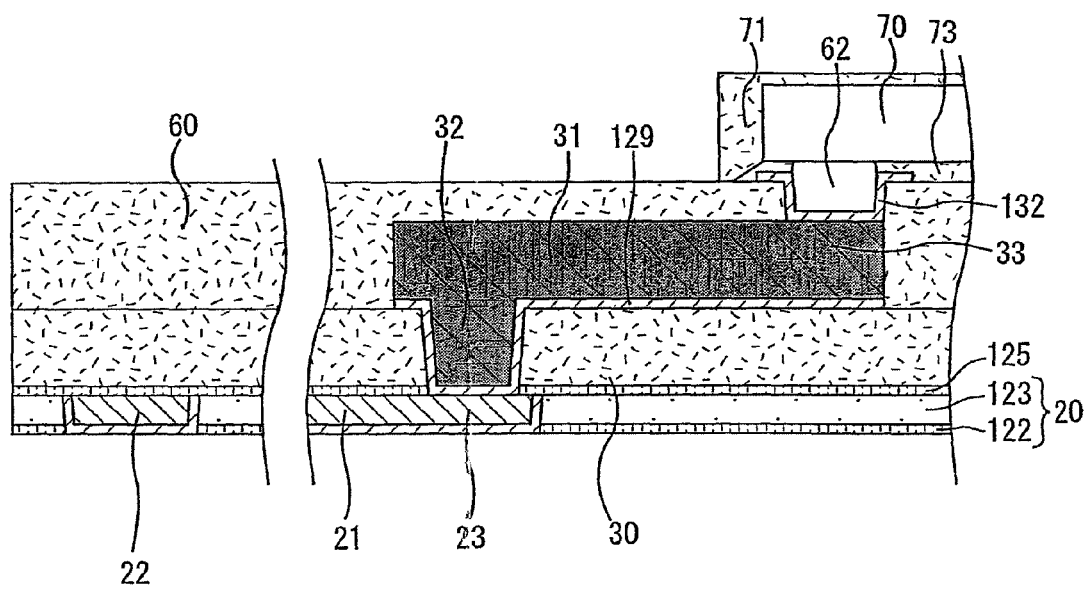
FIG. 15 is a cross-sectional view showing part of a manufacturing process of the interposer of the second embodiment.
Figure 16:
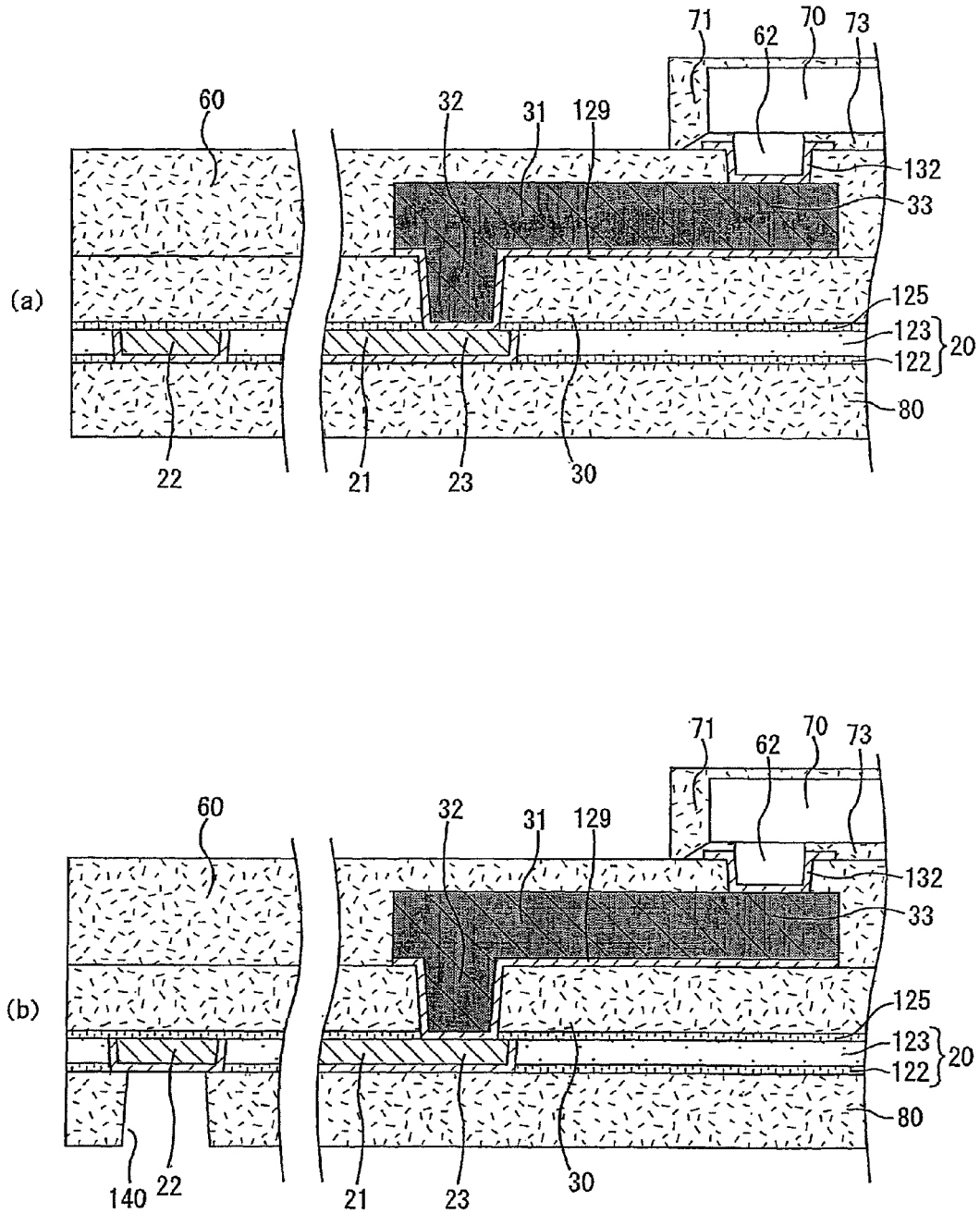
FIGS. 16 (a) and 16 (b) are cross-sectional views showing part of the manufacturing process of the interposer of the second embodiment.

FIG. 15 is a cross-sectional view showing part of the manufacturing processes of the interposer of the second embodiment. As shown in FIG. 15, in the present embodiment, for the interposer on which the second electronic component as shown in FIG. 11 (b) in the first embodiment, the first land 22 is exposed from the second side by removing the supporting substrate. As a method for removing the supporting substrate, a method similar to that in the first embodiment may be used. FIG. 16 (a), FIG. 16 (b), FIG. 17 (a), FIG. 17 (b), FIG. 18 (a) and FIG. 18 (b) are cross-sectional views showing parts of the manufacturing processes of the interposer of the second embodiment. First, as shown in FIG. 16 (a), the third insulating layer 80 made of an organic insulating layer is formed on a second surface of a layer including structures such as the first insulating layer 20, the first pad 22, the second land 23 and the first wire 21, and an aperture (second opening 140) is formed as shown in FIG. 16 (b). Here, a third opening and a fourth opening not shown in the drawing are formed at the same time. The second opening 140, the third opening and the fourth opening are formed under the first land 22, the third land (not shown) and the fourth land (not shown), respectively. Next, as shown in FIG. 17 (a), a seed layer 141 is formed on the top surface of the third insulating layer 80 (including the wall surface of each opening) and the top surface of each land exposed from each opening.

Figure 17:
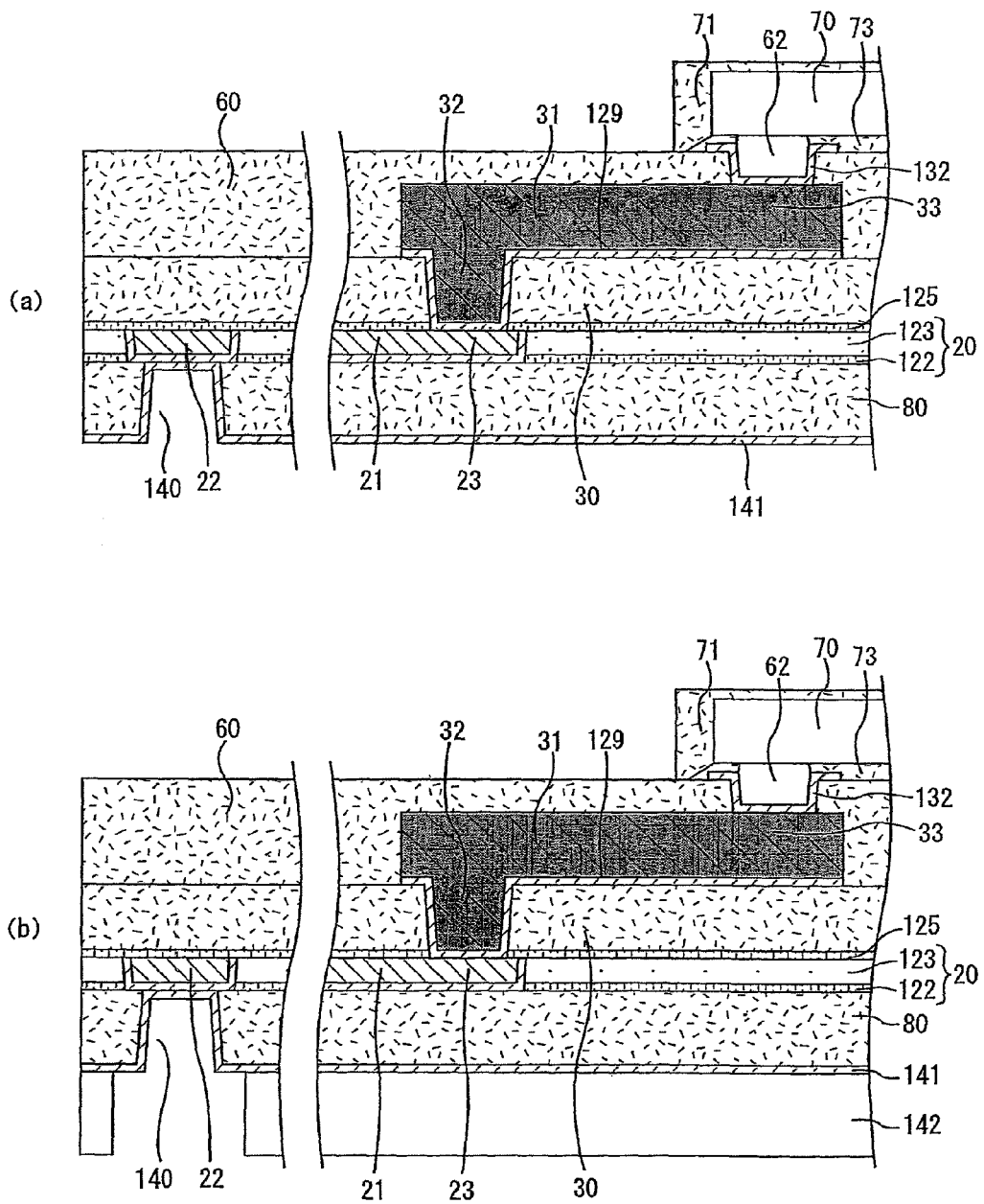
FIGS. 17 (a) and 17 (b) are cross-sectional views showing part of the manufacturing process of the interposer of the second embodiment.
Figure 18:
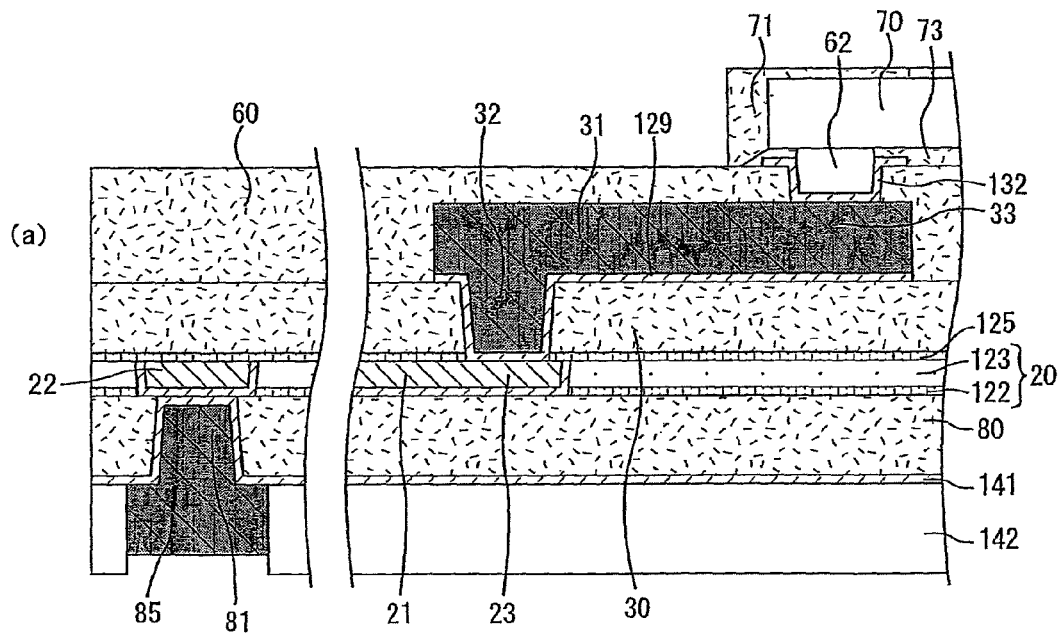
FIGS. 18 (a) and 18 (b) are cross-sectional views showing part of the manufacturing process of the interposer of the second embodiment.
Figure 18:
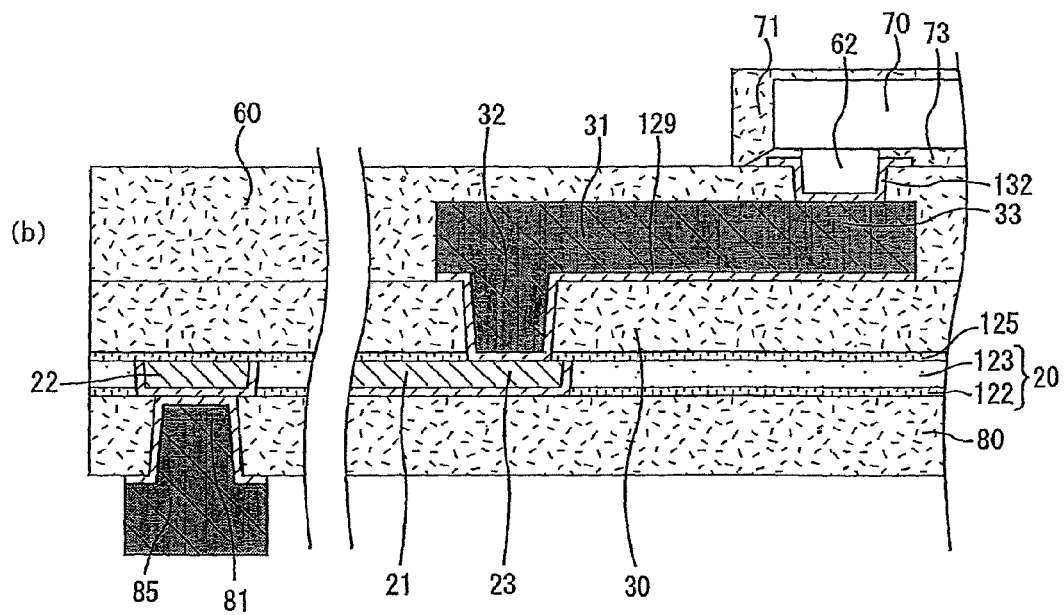

Next, as shown in FIG. 17 (b), a plating resist material 142 is formed, and by exposing via a mask and developing the plating resist material 142, the plating resist material 142 in the sites for forming the fourth wire, the first pad, the third pad and the fourth pad is removed. As shown in FIG. 18 (a), electrolytic copper plating is performed with the seed layer 141 as an electricity supply layer to provide copper plating at the sites where the plating resist material 142 is removed. Thereby, within the third insulating layer 80, a second via conductor 81, a third via conductor (not shown) and a fourth via conductor (not shown) are formed. Furthermore, on the third insulating layer 80, a fourth wire (not shown), a first pad 85, a third pad (not shown) and a fourth pad (not shown) are formed. Next, as shown in FIG. 18 (b), the remaining plating resist material is removed and the seed layer under the removed plating resist material is removed by etching.

With the processes described above, the third insulating layer, the second via conductor, the third via conductor, the fourth via conductor, the fourth wire, the first pad, the third pad and the fourth pad can be formed.

Figure 19:
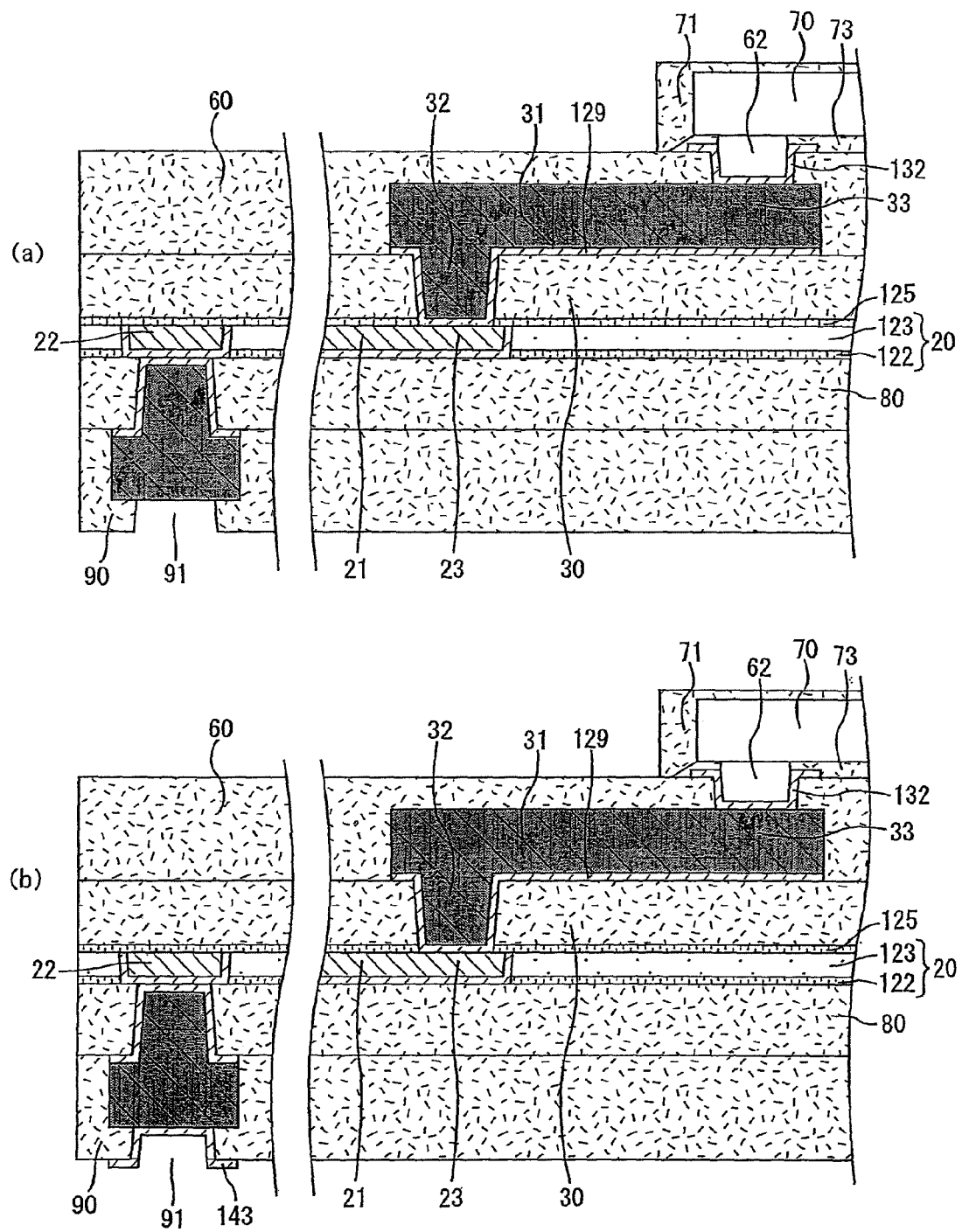
FIGS. 19 (a) and 19 (b) are cross-sectional views showing part of the manufacturing process of the interposer of the second embodiment.

FIG. 19 (a) and FIG. 19 (b) are cross-sectional views showing parts of the manufacturing processes of the interposer of the second embodiment. Forming of the first protective film can be performed in a manner similar to the forming of the second protective film. As shown in FIG. 19 (a), an organic layer to be the first protective film 90 is formed, and the aperture 91 is formed at the sites corresponding to the surface of each pad, and furthermore, as shown in FIG. 19 (b), the barrier metal layer 143 is formed in the aperture 91. With this process, the first protective film 90 can be formed. In addition, forming of the first protective film and forming of the barrier metal layer may be performed as needed.

The processes for loading the first electronic component and the third electronic component on the interposer is hereinafter described. FIG. 20 (a) and FIG. 20 (b) are cross-sectional views showing an example of processes for loading the electronic components on the interposer. The procedure is similar to the process for loading the second electronic component, and the first electronic component 50 is loaded by forming the bump 92 made of solder in the barrier metal layer 143 and connecting this bump 92 to an electrode (not shown) of the first electronic component 50 by means of flip-chip mounting, as shown in FIG. 20 (a). The first electronic component 50 is loaded on the first pad and the third pad, and a third electronic component (not shown) is loaded on the fourth pad similarly. Then, an underfill resin 53 is filled between the loaded electronic component 50 and the interposer and cured. Next, the circumference of the loaded electronic component 50 is sealed with a sealing resin 51. These processes are collectively shown in FIG. 20 (b).

Advantages of the interposer of the present embodiment and a method for manufacturing the interposer are described below. In the present embodiment, advantages (1) to (12) described in the first embodiment can be realized along with the followings.

(13) In the interposer of the present embodiment, the third electronic component can be further loaded on the second side of the first insulating layer in the state electrically connected to the first electronic component.

(14) The third land, the fourth land, and the third wire are formed in the first insulating layer, with the third wire electrically connecting the third land and the fourth land. The third land is provided within the forming region of the pad connected to the first electronic component (projection region of the first electronic component), and the fourth land is provided outside the forming region of the pad connected to the first electronic component. Therefore, from the third pad electrically connected to an electrode of the first electronic component, the third wire, which is a minute wire, is used to distribute wiring and can be drawn outside the forming region of the pad connected to the first electronic component to be connected to the fourth land. That is, the wiring can be drawn from a region requiring minute wiring to a region with less need for minute wiring.

(15) The wiring connecting the third pad and the fourth pad is mainly connected by the fourth wire, which has a longer wire length, a greater thickness, and lower wire resistance per unit length than the third wire. Therefore, an interposer suitable for high-volume signal transmissions with wire resistance between the first electronic component and the third electronic component effectively reduced can be achieved.

(16) The third electronic component is positioned where the second electronic component and part of the forming region of its pad are overlapped. By positioning the electronic components on both sides in this manner, the surface area of the interposer can be reduced.

Third Embodiment

The third embodiment, which is one embodiment of the first invention, is described as follows.

Figure 21:
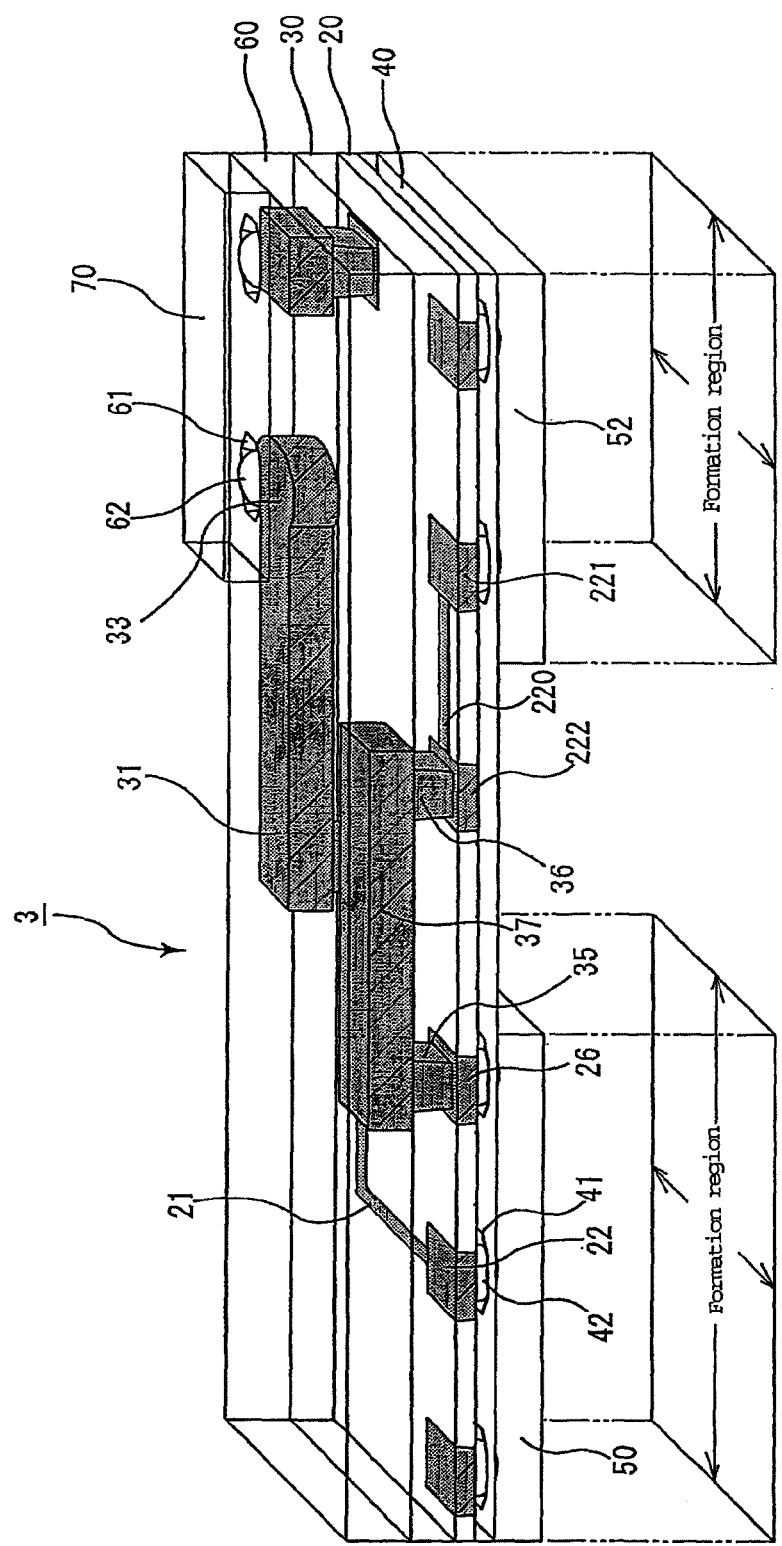
FIG. 21 is a perspective cross-sectional view showing part of an interposer according to the third embodiment of the present invention.

FIG. 21 is a perspective cross-sectional view showing a part of the interposer according to the third embodiment. The interposer 3 of the present embodiment has a first pad (first land 22), a third pad (third land 26) and a fifth land (fifth land 221), with a land provided in the first insulating layer 20 serving as a pad for loading an electronic component on the second side of the first insulating layer 20 as well in a manner similar to the first embodiment. In FIG. 21, it is shown that the first electronic component 50 and the third electronic component 52 are loaded. The second electronic component 70 is loaded in a manner similar to the first embodiment.

In the present embodiment, unlike the second embodiment, no wiring is formed on the second side of the first insulating layer, and the first electronic component 50 and the third electronic component 52 are connected via the wiring provided in the first insulating layer and the wiring provided on the first side of the first insulating layer.

The wiring between the first electronic component 50 and the third electronic component 52 is described as follows. In the interposer 3 of the present embodiment, a third pad (third land 26), a fifth pad (fifth land 221) and a sixth land 222 are formed on the first insulating layer 20, and the fifth pad (fifth land 221) and the sixth land 222 are electrically connected by a fifth wire 220. These are formed by a damascene method.

The second insulating layer 30 has a fifth opening and sixth opening, and a fifth via conductor 35 and a sixth via conductor 36 are formed in the fifth opening and the sixth opening, respectively. The bottoms of the fifth via conductor 35 and the sixth conductor 36 are connected to the third pad (third land 26) and the sixth land 222, respectively. A sixth wire 37 is formed on the second insulating layer 30, and the sixth wire 37 is electrically connected to the fifth via conductor 35 and the sixth via conductor 36. That is, the sixth wire 37 is connected to the third pad (third land 26) via the fifth via conductor 35 and connected to the fifth wire 220 via the sixth via conductor 36. These via conductors and the sixth wire are formed by a semiadditive method.

In the interposer of the present embodiment, from the first electronic component 50 toward the third electronic component 52, wiring is connected in the order of the third pad (third land 26), the fifth via conductor 35, the sixth wire 37, the sixth via conductor 36, the sixth land 222, the fifth wire 220, the fifth pad (fifth land 221) and the third electronic component 52. That is, from the fifth pad (fifth land 221) on which the third electronic component 52 is located, wiring is distributed using the fifth wire 220, and wiring is drawn to the sixth land 222 outside the forming region of the pad connected to the third electronic component 52 (projection region of the first electronic component). Then, wiring is drawn up from the sixth land 222 to the sixth wire 37 on the second insulating layer via the sixth via conductor 36, and wiring to the fifth via conductor 35 connected to the third pad (third land 26) on which the first electronic component 50 is loaded is achieved via the fourth wire 84. That is, most of the connections between the first electronic component 50 and the third electronic component 52 are achieved via the sixth wire 37.

In addition, the wiring between the first electronic component 50 and the second electronic component 70 is similar to that in the first embodiment. Because the method for manufacturing the interposer of the present embodiment is similar to the first embodiment except that the wire pattern is different, its description is omitted.

Advantages of the interposer of the present embodiment and a method for manufacturing the interposer are described below.

In the present embodiment, advantages (1) to (12) described in the first embodiment can be realized along with the following advantages.

(17) In the interposer of the present embodiment, the third electronic component can be further loaded on the second side of the first insulating layer in the state in which it is electrically connected to the first electronic component. Because the interposer of the present embodiment does not have a supporting substrate and a third insulating layer, an interposer with a thin thickness can be achieved. Therefore, its mounting height when loaded with electronic components can be lowered.

(18) A fifth pad (fifth land), a sixth land and a fifth wire are formed in the first insulating layer, with the fifth wire electrically connecting the fifth pad (fifth land) and the sixth land. The fifth pad (fifth land) is provided within the forming region of the pad connected to the third electronic component (projection region of the third electronic component), and the sixth land is provided outside the forming region of the pad connected to the third electronic component. Therefore, from the fifth pad (fifth land) electrically connected to an electrode of the third electronic component, the fifth wire, which is a minute wire, is used to distribute wiring, and the fifth wire can be drawn outside the forming region of the pad connected to the third electronic component to be connected to the sixth land. That is, the wiring can be drawn from a region requiring minute wiring to a region with less need for minute wiring.

(19) The wiring connecting the fifth pad (fifth land) and the third pad (third land) is mainly connected by the sixth wire, which has low wire resistance per unit length. Therefore, an interposer suitable for high-volume signal transmissions with an effectively reduced wire resistance between the first electronic component and the third electronic component can be achieved.

Fourth, Fifth and Sixth Embodiments

Figure 22:
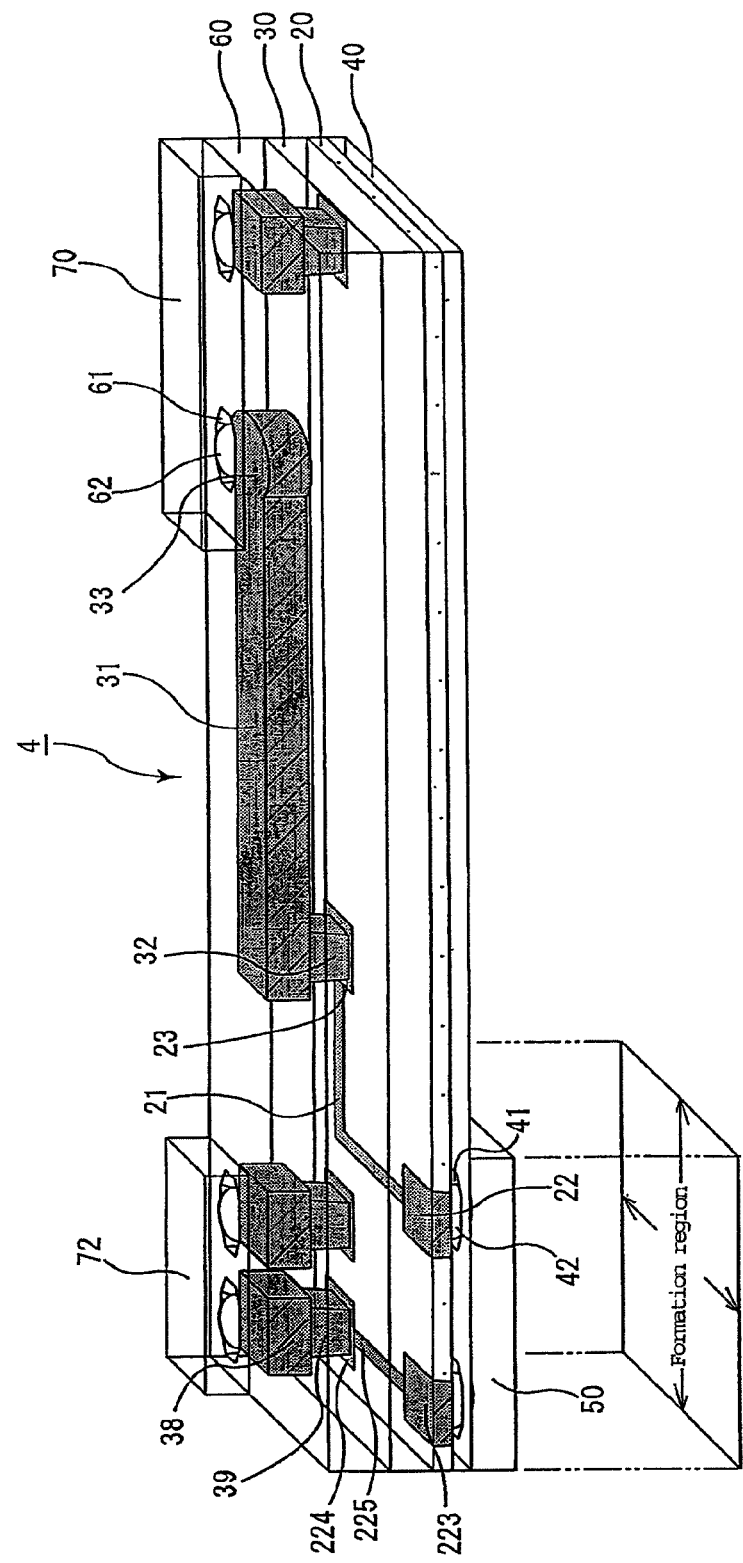
FIG. 22 is a perspective cross-sectional view showing part of an interposer according to the fourth embodiment of the present invention.

An interposer according to the fourth embodiment of the present invention is described below. FIG. 22 is a perspective cross-sectional view showing a part of an interposer according to the fourth embodiment. In addition to the interposer of the first embodiment, the interposer 4 of the present embodiment further has a seventh pad (seventh land 223), an eighth land 224 and a seventh wire 225 on the first insulating layer, and has a sixth pad 38 on the second insulating layer. FIG. 22 shows a fourth electronic component 72 being loaded.

The fourth electronic component 72 is electrically connected to the first component 50, and part of the forming region of the pad connected to the fourth electronic component 72 (projection region of the fourth electronic component) is overlapped with the forming region of the pad connected to the first electronic component 50 (projection region of the first electronic component).

The wiring between the first electronic component 50 and the fourth electronic component 72 is described below. In the interposer 4 of the present embodiment, a seventh pad (seventh land 223) and an eighth land 224 are formed on the first insulating layer 20, and the seventh pad (seventh land 223) and the eighth land 224 are electrically connected by a seventh wire 225. These are formed by a damascene method.

The second insulating layer 30 has a seventh opening, and a seventh via conductor 39 is formed in the seventh opening. On the seventh via conductor 39, the sixth pad 38 is further formed. The bottom of the seventh via conductor 39 is connected to the eighth land 224. The seventh via conductor 39 and the sixth pad 38 are formed by a semiadditive method.

In the interposer of the present embodiment, from the first electronic component 50 toward the fourth electronic component 72, wiring is connected in the order of the seventh pad (seventh land 223), the seventh wire 225, the eighth land 224, the seventh via conductor 39, the sixth pad 38 and the fourth electronic component 72. The wiring between the first electronic component 50 and the second electronic component 70 is similar to that in the first embodiment.

Figure 23:
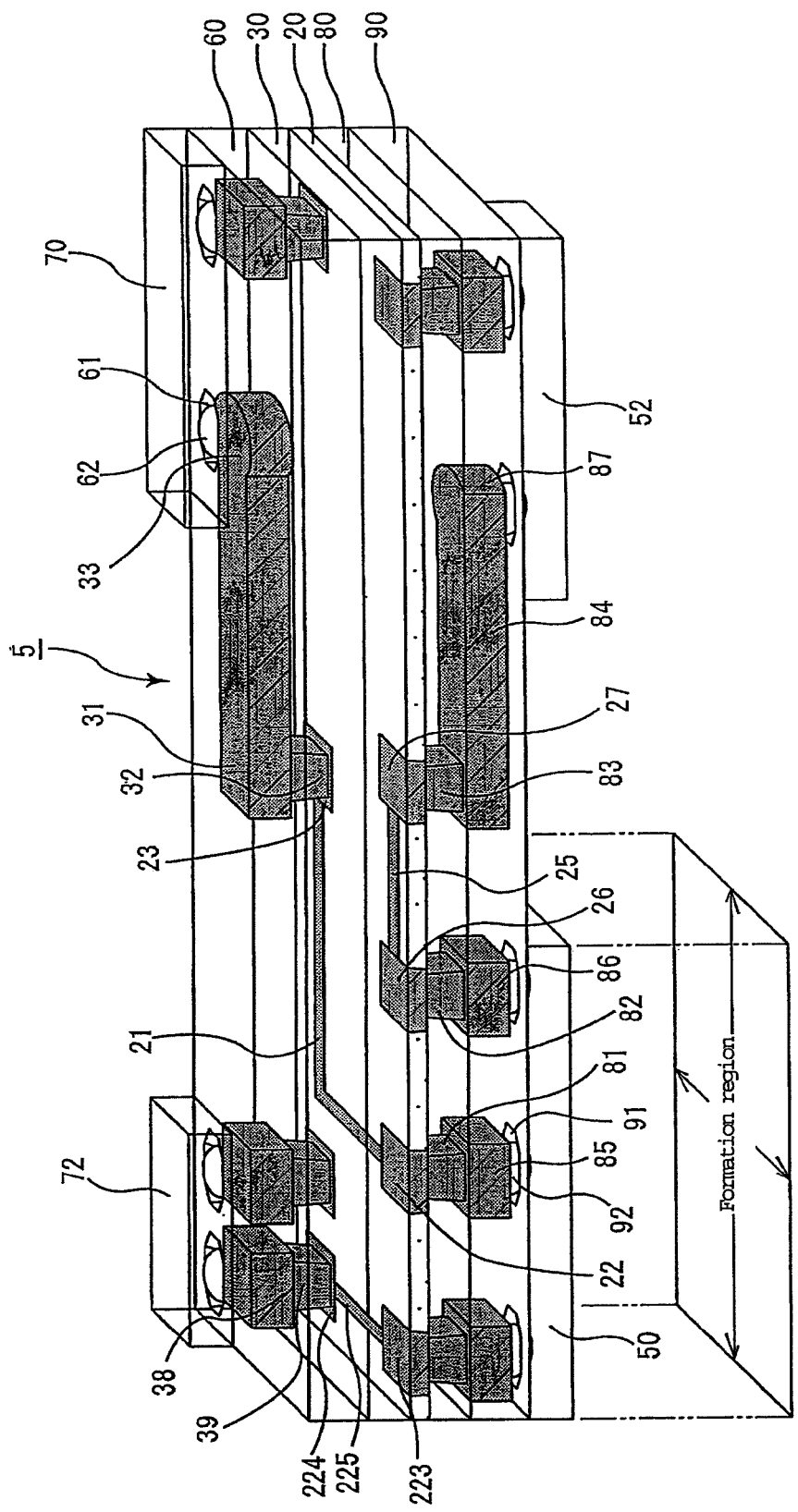
FIG. 23 is a perspective cross-sectional view showing a part of an interposer according to the fifth embodiment of the present invention.
Figure 24:
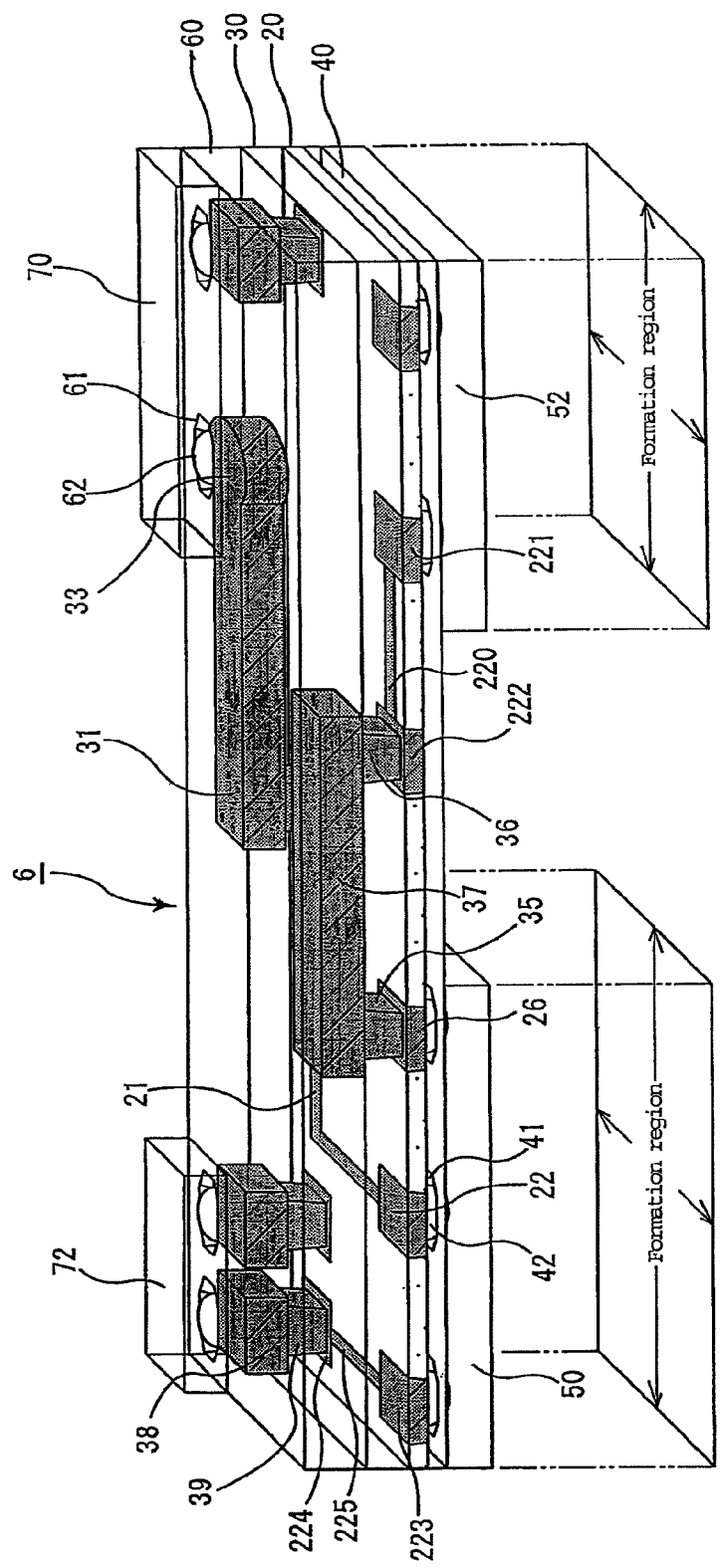
FIG. 24 is a perspective cross-sectional view showing part of an interposer according to the sixth embodiment of the present invention.

Next, interposer according to the fifth embodiment and the sixth embodiment of the present invention are described as follows. The interposers according to the fifth embodiment and the sixth embodiment has a fourth electronic component which can be loaded in a manner similar to the fourth second embodiment in addition to the interposers of the second embodiment and the third embodiment. FIG. 23 is a perspective cross-sectional view showing a part of the interposer of the fifth embodiment. FIG. 24 is a perspective cross-sectional view showing a part of the interposer of the sixth embodiment.

In the interposer 5 of the fifth embodiment and the interposer 6 of the sixth embodiment, preferable structures of the seventh land 223, the eighth land 224, the seventh wire 225, the seventh via conductor 39, the sixth pad 38 and the fourth electronic component 72 are similar to the fourth embodiment. In addition, because other structures are similar to the second embodiment and the third embodiment, their descriptions are omitted.

In addition, because the methods for manufacturing the interposers of the fourth, fifth and sixth embodiments are similar to the first embodiment except that their wiring patterns are different, their descriptions are omitted.

In the fourth, fifth, and sixth embodiments, connections between the first electronic component 50 and the fourth electronic component 72 may be achieved by sharing lands for loading each electronic component. In this case, the seventh wire 225 and the eighth land 224 are not formed and the seventh via conductor and the sixth pad are formed in that order on the seventh pad (seventh land 223). Then, each electronic component is loaded so that the wiring from a connecting terminal of the first electronic component 50 to a connecting terminal of the fourth electronic component 72 will be in line in the thickness direction.

In the fourth, fifth, and sixth embodiments, the advantages (1) to (12) described in the first embodiment can be realized along with the following advantage.

(20) In the interposer of the fourth, fifth, and sixth embodiments, the fourth electronic component can be further loaded on the first side of the first insulating layer in the state electrically connected to the first electronic component.

Seventh Embodiment

Figure 25:
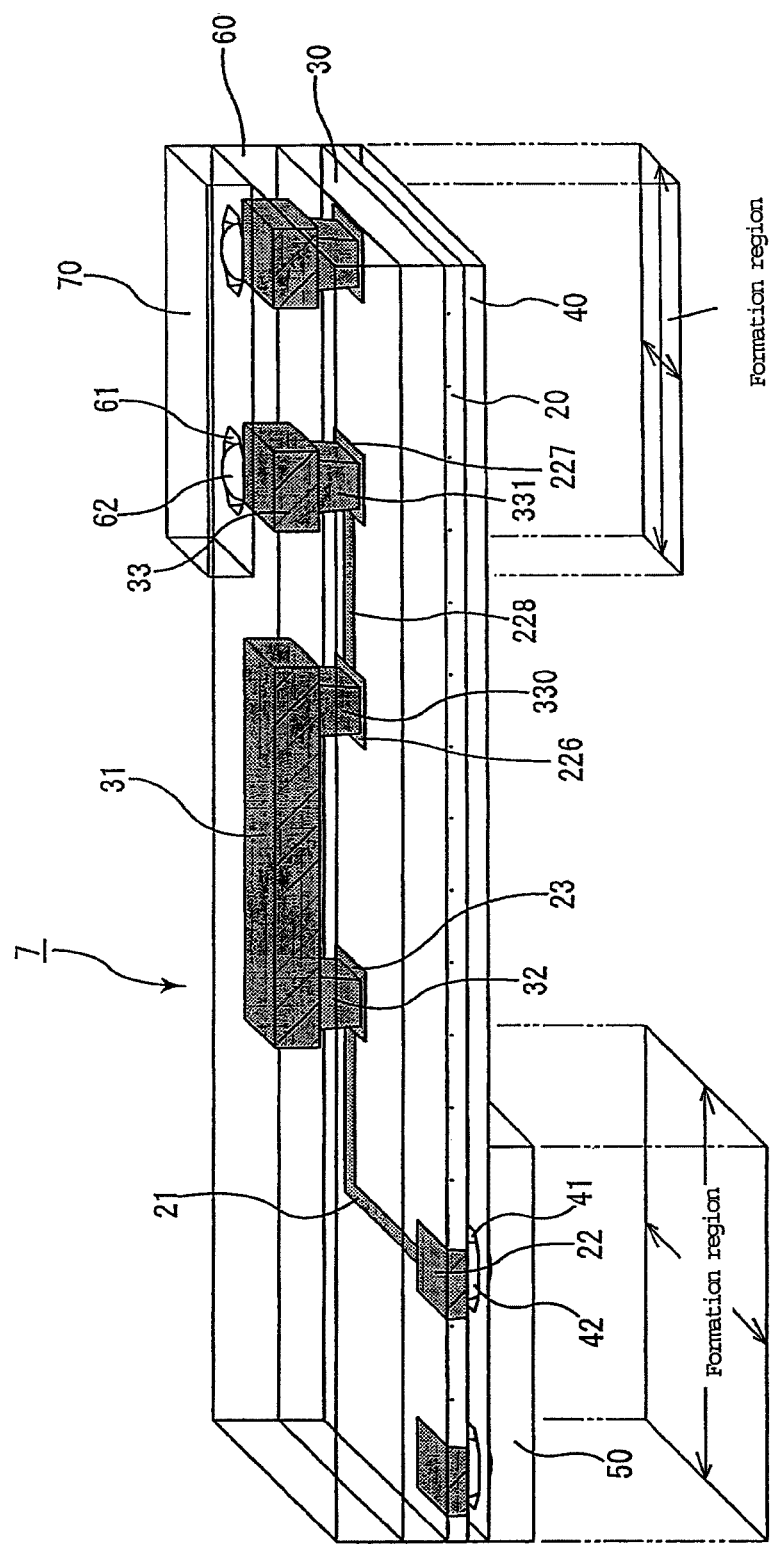
FIG. 25 is a perspective cross-sectional view showing part of an interposer according to the seventh embodiment of the present invention.

An interposer according to the seventh embodiment of the present invention is described as follows. FIG. 25 is a perspective cross-sectional view showing a part of the interposer of the seventh embodiment. In addition to the interposer of the first embodiment, the interposer 7 of the present embodiment further has a ninth land 226, a tenth land 227 and an eighth wire 228 on the first insulating layer, and has a eighth via conductor 330 and a ninth via conductor 331 within the second insulating layer.

In the interposer 7 of the present embodiment, the second wire 31 and the second pad 33 in the interposer of the first embodiment are not integrated, and the connecting methods of the second wire 31 and the second pad 33 are different.

In the interposer 7 of the present embodiment, a ninth land 226, a tenth land 227 and an eighth wire 228 are formed on the first insulating layer 20, with the ninth land 226 and the tenth land 227 electrically connected by the eighth wire 228. These are formed by a damascene method. Because the tenth land 227 is located inside and the ninth land 226 is located outside in relation to the forming region of the pad connected to the second electronic component 70 (projection region of the second electronic component), the wiring connected to the second electronic component 70 can be drawn outside the projection region of the second electronic component through the eighth wire 228.

The second insulating layer 30 has an eighth opening and a ninth opening, and an eighth via conductor 330 and a ninth via conductor 331 are formed in the eighth opening and the ninth opening, respectively. The bottoms of the eighth via conductor 330 and the ninth conductor 331 are connected to the ninth land 226 and the tenth land 227, respectively. The eighth via conductor 330 is connected to the second wire 31 on its top surface, and the ninth via conductor 331 is connected to the second pad 33 on its top surface. The eighth via conductor 330 and the ninth pad 331 are formed by a semiadditive method.

In the interposer of the present embodiment, from the first electronic component 50, wiring is connected in the order of the first electronic component 50, the first pad (first land 22), the first wire 21, the second land 23, the first via conductor 32, the second wire 31, the eighth via conductor 330, the ninth land 226, the eighth wire 228, the tenth land 227, the ninth via conductor 331, the second pad 33 and the second electronic component 70. That is, from the tenth land 227 connected to the second pad 33 on which the second electronic component is loaded, wiring is distributed using the eighth wire 228, and wiring is drawn to the ninth land 226 outside the forming region of the pad connected to the second electronic component (projection region of the second electronic component). Then, wiring is drawn up from the ninth land 226 to the second wire 31 on the second insulating layer via the eighth via conductor 330, and most of the connections between the first electronic component 50 and the second electronic component 70 are achieved via the second wire 31.

Because the method for manufacturing the interposer of the present embodiment is similar to that of the first embodiment except that the wire pattern is different, its description is omitted. In addition, in the interposers of the second to sixth embodiments, the connecting method of the second wire and the second pad may be done as in the present embodiment.

In the present embodiment, the advantages (1) to (12) described in the first embodiment can be realized along with the following advantage.

(21) The tenth land is provided within the forming region of the pad connected to the second electronic component (projection region of the second electronic component), and the ninth land is provided outside the forming region of the pad connected to the second electronic component. Therefore, from the tenth land electrically connected to an electrode of the second electronic component, the eighth wire, which is a minute wire, is used to distribute wiring, and can be drawn outside the forming region of the pad connected to the second electronic component to be connected to the ninth land. That is, the wiring can be drawn from a region requiring minute wiring to a region with less need for minute wiring.

Eighth Embodiment

Figure 26:
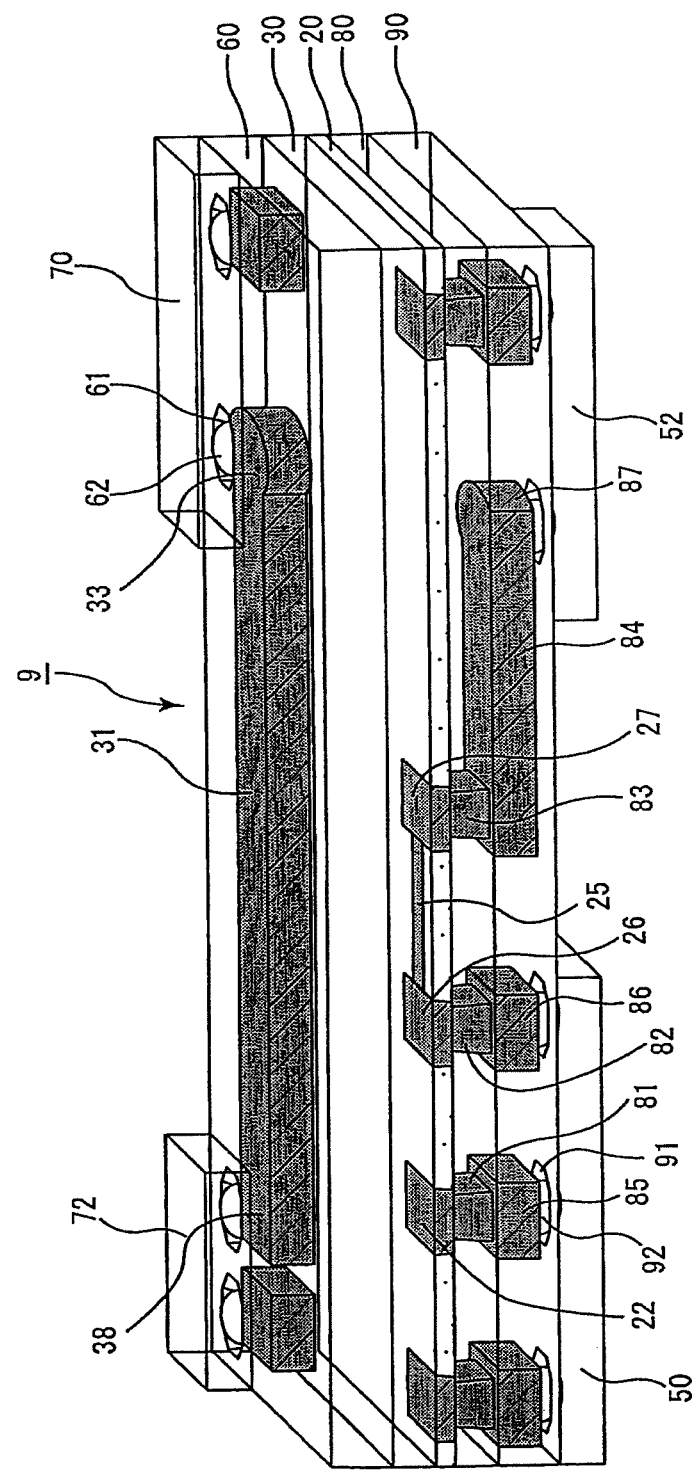
FIG. 26 is a perspective cross-sectional view showing part of an interposer according to the eighth embodiment of the present invention.

An interposer according to the eighth embodiment of the present invention is structured so that some specific electronic components among multiple electronic components are connected via the second wiring only. FIG. 26 is a perspective cross-sectional view showing a part of another interposer according to the present invention. The interposer 9 shown in FIG. 26 has a second pad 33 for loading a second electronic component 70 and a fourth pad 38 for loading a fourth electronic component 72, and the second pad 33 and the fourth pad 38 are connected via a second wiring 31.

In the interposer 9 of the present embodiment, from the second electronic component 70, wiring is connected in the order of the second pad 33, the second wiring 31 and the fourth pad 38, and a first wiring is not provided between the second electronic component 70 and the fourth electronic component 72. As in the second embodiment, the first component 50 and the third component 52 are connected via a third wiring 25, which is a minute wire, and a fourth wiring 84, which is a wire with lower wire resistance.

Examples of the electronic components used in this eighth embodiment include a power regulator module for the second electronic component and a CPU for the fourth electronic component. By connecting these electronic components via the second wiring only, the resistance of the wiring between the electronic components may be further lowered. As a result, proper voltage can be applied to electronic components such as a CPU without creating a voltage drop in the second wiring.

Ninth Embodiment

Figure 27:
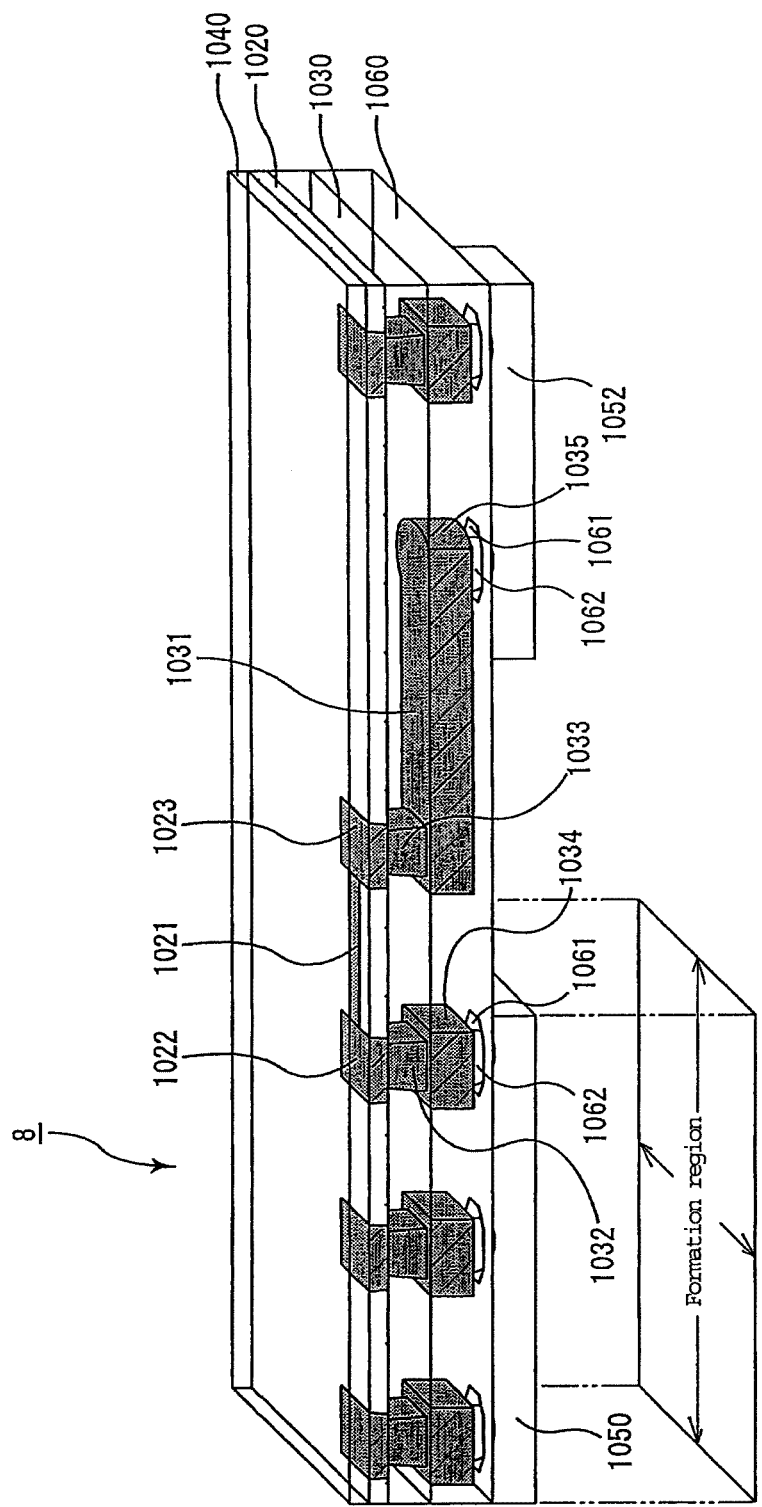
FIG. 27 is a perspective cross-sectional view showing part of an interposer according to the ninth embodiment of the present invention.

An interposer according to the ninth embodiment of the present invention and a method for manufacturing such an interposer are described below. FIG. 27 is a perspective cross-sectional view showing a part of the interposer according to the ninth embodiment. The interposer 8 of the present embodiment has a first insulating layer 1020 made of an inorganic material, a first wire 1021 formed within the first insulating layer, a second protective film 1040 provided on a second side (upper side of FIG. 27) of a layer including structures such as the first insulating layer, a second insulating layer 1030 made of an organic material formed on a first side (lower side of FIG. 27) of the layer including structures such as the first insulating layer, a second wire 1031 formed on the second insulating layer (lower side of FIG. 27), and a first protective film 1060 provided on the second insulating layer. In FIG. 27, it is shown that the first electronic component 1050 and the second electronic component 1052 are loaded on the first protective film (lower side of FIG. 27).

In reference to FIG. 27, details of each of these elements are sequentially described below.

In this embodiment, even if an element is indicated with the same term as in the previous embodiments, its position may be different from the position in the previous embodiments. For example, the "first protective film" is formed on a second side of a layer including structures such as a first insulating layer in the previous embodiments, but it is formed on a second insulating layer in this embodiment. In addition, the "first via conductor" is connected to the second wire in the previous embodiments, but it is connected to the first land in this embodiment.

First, the first insulating layer and its surrounding structures are described. The first insulating layer 1020 is a layer made of a similar inorganic material as in the first embodiment, and the first land 1022 and the second land 1023 are formed therein. The first land 1022 and the second land 1023 are electrically connected by the first wire 1021. These are formed by a damascene method. Because the first land 1022 is located inside and the second land 1023 is located outside in relation to the forming region of the pad connected to the first electronic component 1050 (projection region of the first electronic component), the wiring connected to the first electronic component 1050 can be drawn outside the projection region of the first electronic component through the first wire 1021.

Next, the second protective film is described. The second protective film 1040 is an insulating film made of a similar material as the protective film in the first embodiment. The second protective film 1040 is provided on a second side (upper side of FIG. 27) of a layer including the first insulating layer 1020, the first land 1022, the second land 1023 and the first wire 1021. Although omitted in the drawing, in the predetermined position of the second protective film 1040, an aperture and a barrier metal layer are formed in a manner similar to the first embodiment. Then, via a solder bump formed in the aperture, the interposer is mounted on a printed-wire board.

Next, the second insulating layer and its surrounding structures are described. The second insulating layer 1030 is made of an organic material and is formed on a first side (lower side of FIG. 27) of a layer including structures such as the first insulating layer 1020, the first land 1022, the second land 1023 and the first wire 1021. Within this second insulating layer 1030, a first via conductor 1032 is formed. Furthermore, a second wire 1031 and a second pad 1033 are formed on the second insulating layer 1030.

The second insulating layer 1030 has a first opening and a second opening. In each opening, the first via conductor 1032 and the second via conductor 1033 are formed, and the bottoms of the first via conductor 1032 and the second via conductor 1033 (upper side of FIG. 27) are connected to the first land 1022 and the second land 1023. The second wire 1031 is formed on the second insulating layer 1030 (lower side of FIG. 27), and the second wire 1031 is electrically connected to the second via conductor 1033. The first pad 1034 for loading the first electronic component 1050 is formed on the first via conductor 1032 (lower side of FIG. 27). The second pad 1035 for loading the second electronic component 1052 is formed on the second insulating layer 1030 (lower side of FIG. 27). The second pad 1035 is integrated with the second wire 1031, and the second pad 1035 and the second wire 1031 are electrically connected.

Next, the first protective film and the structures surrounding the first protective film are described. The first protective film 1060 is formed on the second insulating layer 1030 (lower side of FIG. 27) and on the second wire. The first protective film 1060 has an aperture 1061 partly exposing the first pad 1034 and the second pad 1035. That is, the outer edges of the first pad 1034 and the second pad 1035 are coated with the first protective film 1060. Then, in each aperture 1061, a bump 1062 made of solder is formed via a seed layer, and this bump 1062 and an electrode of each electronic component are connected.

In the interposer of the present embodiment as described thus far, from the first electronic component 1050, wiring is connected in the order of the first pad 1034, the first via conductor 1032, the first land 1022, the first wire 1021, the second land 1023, the second via conductor 1033, the second wire 1031, the second pad 1035 and the second electronic component 1052. That is, from the first land 1022 electrically connected to the first pad 1034 on which the first electronic component 1050 is loaded, wiring is distributed between the first lands using the first wire 1021, and wiring is drawn to the second land 1023 outside the forming region of the first pad. Then, wiring is drawn up from the second land 1023 to the second wire 1031 on the second insulating layer via the second via conductor, and most of the connections between the first electronic component 1050 and the second electronic component 1052 is achieved via the second wire 1031.

In the present embodiment, preferable structures such as materials and dimensions of each insulating layer, each land, each via conductor, each pad and each wire may be the same as those in the first embodiment.

Other Embodiments

Interposers according to other embodiments of the present invention are described below. In each embodiment, preferable structures such as materials and dimensions of each insulating layer, each land, each via conductor, each pad and each wire may be the same as those in the first embodiment. The structure of wiring formed in an insulating layer made of an inorganic material such as a first insulating layer may be the same as the first wire. The structure of wiring formed within or on an insulating layer made of an organic material such as a second insulating layer and a third insulating layer may be the same as the second wire.

The number of electronic components loaded on the interposer is not particularly limited if there are two or more, and the types and functions of the electronic components and the relationships through which they are connected to each other are also not particularly limited. In addition, the loading pattern of such electronic components is also not particularly limited. That is, multiple electronic components may be mounted in a laminated state. In this case, for example, penetrating electrodes provided on respective electronic components are connected to each other via solder bumps.

The first wire and/or the second wire may be a multilayered wire, with multiple first insulating layers and/or second insulating layers provided.

In the first insulating layer under a region wired by the second wire, at least one of a ground layer and a power layer may be provided. In addition, at least one of a capacitor, an inductor, and a resistor may be provided. The first insulating layer directly below the region wired by the second wire frequently becomes a dead space because it is not necessary to provide minute wires. By providing any of a power plane layer, a ground plane layer and a passive element in such a dead space, this region is effectively utilized, thus providing a high-density interposer without wasted portions. It makes possible to improve the power supply of the interposer and make the interposer thinner and smaller.

In addition, when the ground layer is formed within the first insulating layer, for example, a microstrip structure is formed in conjunction with the second wire located directly above that. As a result, characteristic impedance can be matched, allowing signal propagation to be stabilized.

In addition, on the surface of the interposer, a stiffener may be provided in a manner that the electronic component is surrounded. By providing such a stiffener, an interposer with less warpage can be achieved.

A supporting substrate is not particularly limited if it is a material that is flat and can be used for various film-forming processes. For example, silicon, silicon nitride, silicon carbide, aluminum nitride and mullite can be listed. Among these, silicon is preferable for its high flatness at the surface and for allowing minute wires to be formed.

Materials for forming the first land, the second land and the first wire as well as materials for forming the first via conductor, the second via conductor, the first pad, the second pad and the second wire are not particularly limited if they are conductive materials. In addition to copper, nickel, gold and silver can be mentioned.

Types of the second insulating layer include thermosetting resins such as epoxy resin, phenol resin, polyimide resin, polyester resin, bismaleimide resin, polyolefin resin, polyphenylene ether resin, polyphenylene resin and fluorine resin. In addition, photosensitive resins include acrylic resin, for example.

Resins with a photosensitive group added to part of a thermosetting resin include those obtained through acrylization reaction between a thermoset group of the aforementioned thermosetting resins and methacrylic acid or acrylic acid. In addition, for thermoplastic resins, phenoxy resin, polyether sulfone (PES), poly sulfone (PSF), polyphenylene sulfone (PPS), polyphenylene sulfide (PPES), polyphenylene ether (PPE) and polyether imide (PI) can be mentioned.

In addition, specific combinations of resin combinations that can be used as the second insulating layer include phenol resin and polyether sulfone, polyimide resin and polysulfone, epoxy resin and polyether sulfone, epoxy resin and phenoxy resin, acrylic resin and phenoxy resin, and epoxy resin with a partially acrylized epoxy group and polyether sulfone. This second insulating layer is not limited to the resins described above and may be formed of an inorganic material like the first insulating layer. The third insulating layer may be formed of an inorganic material as well.

The relationship between the diameter of the first land and the diameter of the first via conductor, as well as the relationship between the diameter of the second land and the second via conductor are not particularly limited as long as it is within the range in which conductivity between each land and via conductor can be ensured, and the diameters may be of equal size.

In addition, the types of resists formed on the first insulating layer, the exposure methods and the development methods are not particularly limited if they are resists, exposure methods and development methods used in manufacturing processes of semiconductors.

As a method for forming a seed layer on the first insulating layer and the second insulating layer, in addition to sputtering, methods referred to as PVD (physical vapor deposition), which specifically include methods such as vacuum vapor deposition, ion plating and electron beam vapor deposition, can be used. In addition, as a method for forming a seed layer on the surface of the second insulating layer, conventionally known methods used to form conductor circuits by a semiadditive method can also be used.

The method for forming the second insulating layer is not particularly limited. For example, methods may include applying an uncured resin with a spin coater and a curtain coater or forming a resin layer by thermally compressing a resin film. In addition, methods of curing resin are not limited to thermal curing.

In addition, methods for forming an aperture in an organic insulating layer are not limited to exposure development processing, and methods of making an aperture with laser processing can also be used. These include, for example, methods using an excimer laser, a UV-YAG laser and a carbon dioxide gas laser.

An interposer according to an embodiment of the present invention has a first insulating layer made of an inorganic material, a first land formed in the first insulating layer, a second land formed in the first insulating layer, a first wire formed in the first insulating layer to electrically connect the first land and the second land, a second insulating layer formed on a first surface of the first insulating layer, the first land, the second land, and the first wire, with a first opening for a first via conductor connected to the second land, a first pad for loading a first electronic component mounted on a second side of the first insulating layer, a second pad for loading a second electronic component, formed on the second insulating layer, a second wire formed on the second insulating layer, and a first via conductor formed in the first opening to electrically connect the first land and the second wire. The first pad and the second pad are electrically connected via the first wire and the second wire, and the second wire has a longer wire length and a greater thickness than the first wire.

In the interposer, a first insulating layer made of an inorganic material is provided, and a first land and a second land are formed in the first insulating layer. Then, the first land and the second land are electrically connected via a first wire formed in the first insulating layer.

In addition, on a second insulating layer on a first side of the first insulating layer, a second wire is formed. This second wire has a longer wire length and a greater thickness than the first wire. In other words, the second wire has lower wire resistance per unit length than the first wire. That is, the wires between the first electronic component and the second electronic component are made of the first wire to implement minute drawing and the second wire with lower wire resistance per unit length than the first wire. In these wires between the first electronic component and the second component, by implementing, for example, only minute drawing that is invariably required between the connecting terminals of the first electronic component with the first wire and having most of the wiring between the first electronic component and the second electronic component with the second wire, wire resistance can be effectively reduced. Furthermore, an interposer suitable for high-volume signal transmissions can be achieved. Moreover, minute drawing becomes possible with the first wire of the first insulating layer, and it is therefore not necessary to increase the number of layers to gradually fan out the wiring, allowing the electronic components to be made finer with a small number of layers. In addition, any number of methods for measuring wire resistance can be used. For example, wire resistance can be measured by connecting a resistance measure to the specific wire via a probe.

Measuring instruments include resistance measures (Model: 4194A by Agilent Technologies).

In addition, the interposer has a first pad for loading a first electronic component on a second side of the first insulating layer, as well as a second pad for loading a second electronic component on the second insulating layer. Therefore, when the electronic components are electrically connected, they can be loaded on both the first and second sides of the first insulating layer.

In addition, because the interposer does not have a supporting substrate and wires are drawn with a small number of layers, the interposer has a low thickness. Therefore, the mounting height when electronic components are loaded can be decreased.

An interposer according to another embodiment of the present invention further has a third land formed in the first insulating layer, a fourth land formed in the first insulating layer, a third wire formed in the first insulating layer to electrically connect the third land and the fourth land, a third insulating layer formed on a second surface of the first insulating layer, the first to fourth lands, the first wire, and the third wire, having a second opening for a second via conductor connected to the first land, a third opening for a third via conductor connected to the third land, and a fourth opening for a fourth via conductor connected to the fourth land, a third pad for loading a first electronic component, formed on the third insulating layer, a fourth pad for loading a third electronic component, formed on the third insulating layer, a fourth wire formed on the third insulating layer, a third via conductor formed in the third opening to connect the third pad and the third land, and a fourth via conductor formed in the fourth opening to connect the fourth wire and the fourth land. The first pad is formed on the third insulating layer and is electrically connected to the first land via the second via conductor formed in the second opening, the third pad and the fourth pad are electrically connected via the third wire and the fourth wire, and the fourth wire has a longer wire length and a greater thickness than the third wire.

In this interposer, a first electronic component and a third electronic component on a second side of a first insulating layer, as well as a second electronic component on a first side of the first insulating layer, can be loaded.

A third land and a fourth land are further formed on the first insulating layer. Then, the third land and the fourth land are electrically connected via a third wire formed in the first insulating layer. In addition, on a third insulating layer on a second side of the first insulating layer, a fourth wire is formed. This fourth wire has a longer wire length and a greater thickness than the third wire. That is, the wires between the first electronic component and the third electronic component are made up of the third wire to implement minute drawing and the fourth wire with lower wire resistance per unit length than the third wire.

When the wires are formed in this manner, by implementing minute drawing with the third wire and making up most of the wiring between the first electronic component and the third component with the fourth wire, wire resistance can be effectively reduced. Furthermore, an interposer suitable for high-volume signal transmissions can be achieved.

In addition, in an interposer according to another embodiment, the second wire has a lower wire resistance per unit length than the first wire.

In an interposer according to an embodiment, the length of the second wire relative to the entire wire length connecting the first electronic component and the second electronic component is 60-90%. When the length of the second wire is defined in this manner, the length of the second wire with small wire resistance increases, so it is easy to reduce the wire resistance between the two electronic components.

In an interposer according to another embodiment, the ratio of the thickness of the second wire relative to the thickness of the first wire is greater than 1 and 15 or less. Within this range, the second wire is thick, preventing warpage of the interposer and making it easy to ensure adhesion of the second wire and the organic insulating layer, even when, for example, the organic insulating layer is expanded and shrunk by heat cycle. That is, if the ratio of the thickness of the second wire relative to the thickness of the first wire is less than 1, the rigidity of the interposer is not sufficiently ensured and warpage of the interposer may occur due to differences in the coefficients of thermal expansion between the semiconductor device and the interposer. On the other hand, if the ratio of the thickness of the second wire relative to the thickness of the first wire is greater than 15, given that the widths of the wires are the same, the aspect ratio of the second wire will be increased, so when the organic insulating layer is expanded and shrunk by heat cycle, for example, the second wire will easily follow the expansion and shrinkage of the organic insulating layer and adhesion of the second wire to the organic insulating layer may be reduced.

In an interposer according to another embodiment, the second insulating layer is made of an organic material. Having the second insulating layer made of the organic material allows the impact resistance of the interposer to be enhanced to prevent cracking.

In an interposer according to another embodiment, the second land is provided outside the forming region of the first pad. "Forming region of the first pad" refers to a region including the entire pad and means a predefined region with the smallest flat area. This region is also referred to as a "projection region of the first electronic component." Here, the forming region of the first pad (projection region of the first electronic component) is a region directly below the first electronic component and space for wire is limited, so it is a region that will require minute wire drawing. On the other hand, outside the forming region of the first pad (projection region of the first electronic component) is a region between the electronic components, and there is less need for minute wire drawing. When the second land is provided in such a position, from the first land electrically connected to an electrode (and the first pad connected to the electrode) of the electronic component, the first wire, which is a minute wire, can be drawn through the first land, and the first wire can be drawn outside the forming region of the first pad (projection region of the first electronic component) to be connected to a region with relatively sufficient space. That is, wiring can be drawn from a region requiring minute wiring to a region with less need for minute wiring.

In an interposer according to yet another embodiment, the first wire is formed using a damascene method and the second wire is formed with a semiadditive method. The first wire formed using a damascene method will be a minute wire. In addition, the second wire formed with the semiadditive method will be a wire with a larger cross-sectional area and smaller resistance per unit length than the first wire formed using a damascene method.

In an interposer according to still another embodiment, the L/S of the first wire is smaller than the L/S of the second wire. When the L/S of the first wire is smaller than the L/S of the second wire, it is possible to draw minute wires in the first insulating layer easily.

In an interposer according to still another embodiment, the surface including structures such as the first insulating layer, the first land, the second land and the first wire is flat. When this surface is flat, the interposer may be one in which, for example, a second insulating layer, a first via conductor, and a second wire can be formed precisely on that surface and flatness can be high.

In an interposer according to still another embodiment, the diameter of the first land is greater than the diameter of the first via conductor. When the relationship between the diameters of the land and the via conductor is defined in this manner, the contact area of the land and the via conductor is ensured and conduction becomes good to allow connection reliability of both to be enhanced. In addition, when forming an opening, because an extra portion for the opening is ensured in the land, strict alignment control is not required and the process can be simplified.

In an interposer according to another embodiment, the diameter of the first land is equal to the diameter of the first via conductor. When the relationship between the diameters of the land and the via conductor is defined in this manner, an extra portion for an opening is not formed in the land, so spacing between the lands can be ensured to be larger than normal, allowing the wiring to have higher density.

In an interposer according to another embodiment, a first protective film having an aperture on the first pad is further provided. In addition, in an interposer according to another embodiment, a second protective film having an aperture on the second pad is further provided. Through this, the inner wire layers are protected to prevent damage.

In an interposer according to yet another embodiment, multiple first insulating layers are provided. The coefficient of thermal expansion of the interposer can be reduced by providing multiple first insulating layers made of an inorganic material.

In an interposer according to another embodiment, an inorganic film is provided between the first insulating layer and the second insulating layer. When the inorganic film is provided between the first insulating layer and the second insulating layer, adhesion between the first insulating layer and the second insulating layer can be improved.

An interposer according to another embodiment has a first insulating layer made of an inorganic material, a first land formed in the first insulating layer, a second land formed in the first insulating layer, a first wire formed in the first insulating layer to electrically connect the first land and the second land, a second insulating layer formed on a first surface of the first insulating layer, the first land, the second land, and the first wire, having a first opening for a first via conductor connected to the second land and a second opening for a second via conductor connected to the second land, a second pad for loading a second electronic component, formed on the second insulating layer, a second pad formed on the second insulating layer for loading a first electronic component provided in parallel with the first electronic component, a second wire formed on the second insulating layer, a first via conductor formed in the first opening to electrically connect the first land and the first pad, and a second via conductor formed in the second opening to electrically connect the first land and the second wire. The first pad and the second pad are electrically connected via the first wire and the second wire, and the second wire has a longer wire length and a larger cross-sectional area than the first wire.

In the interposer, a first insulating layer made of an inorganic material is provided, and a first land and a second land are formed in the first insulating layer. Then, the first land and the second land are electrically connected via a first wire formed in the first insulating layer.

In addition, on a second insulating layer on a first side of the first insulating layer, a second wire is formed. This second wire has a longer wire length and a larger cross-sectional area than the first wire. In other words, the second wire has lower wire resistance per unit length than the first wire. That is, the wires between the first electronic component and the second electronic component is made up of the first wire to implement minute drawing and the second wire with lower wire resistance per unit length than the first wire. In these wires between the first electronic component and the second component, by implementing, for example, only minute drawing that is invariably required between connecting terminals of the first electronic component with the first wire and making up of most of the wiring between the first electronic component and the second component with the second wire, wire resistance can be effectively reduced. Furthermore, an interposer suitable for high-volume signal transmissions can be obtained. Moreover, minute drawing becomes possible with the first wire of the first insulating layer, thereby making it unnecessary to increase the number of the layers to gradually fan out the wire, allowing the electronic components to be made finer with a small number of layers.

In addition, the interposer has a first pad for loading a first electronic component and a second pad for loading a second electronic component on the second insulating layer. Therefore, when the electronic components are electrically connected, they can be loaded on the first side of the first insulating layer.

In addition, because the interposer does not have a supporting substrate and wires are drawn with a small number of layers, it is an interposer with thin thickness. Therefore, the mounting height when electronic component are loaded can be lowered.

An interposer according to another embodiment further has a third land formed in the first insulating layer, a fourth land formed in the first insulating layer, a third wire formed in the first insulating layer to electrically connect the third land and the fourth land, a third opening for a third via conductor connected to the third land, formed in the second insulating layer, a third insulating layer formed on a second surface of the first insulating layer, the first to fourth lands, the first wire, and the third wire, having a fourth opening for a fourth via conductor connected to the fourth land, a third pad for loading a first electronic component, formed on the second insulating layer, a fourth pad for loading a third electronic component, formed on the third insulating layer, a fourth wire formed on the third insulating layer, a third via conductor formed in the third opening to connect the third pad and the third land, and a fourth via conductor formed in the fourth opening to connect the fourth wire and the fourth land. The third pad and the fourth pad are electrically connected via the third wire and the fourth wire, and the fourth wire has a longer wire length and a larger cross-sectional area than the third wire.

In the interposer, a first electronic component and a second electronic component on a first side of a first insulating layer, as well as a third electronic component on a second side of the first insulating layer, can be loaded.

A third land and a fourth land are further formed on the first insulating layer. Then, the third land and the fourth land are electrically connected via a third wire formed in the first insulating layer. In addition, on a third insulating layer on a second side of the first insulating layer, a fourth wire is formed. This fourth wire has a longer wire length and a larger cross-sectional area than the third wire. That is, the wires between the first electronic component and the third electronic component are made up of the third wire to implement minute drawing and the fourth wire with lower wire resistance per unit length than the third wire.

When the wires are formed in this manner, by implementing minute drawing with the third wire and making up of most of the wiring between the first electronic component and the third component with the fourth wire, wire resistance can be effectively reduced. Furthermore, an interposer suitable for high-volume signal transmissions can be achieved.

In addition, in an interposer according to another embodiment, the second wire has a lower wire resistance per unit length than the first wire.

In an interposer according to another embodiment, the length of the second wire relative to the entire wire length connecting the first electronic component and the second electronic component is 60-90%. In addition, in an interposer according to another embodiment, the ratio of the thickness of the second wire relative to the thickness of the first wire is greater than 1 and 15 or less. In addition, in an interposer according to another embodiment, the second insulating layer is made of an organic material.

In an interposer according to another embodiment, the second land is provided outside the forming region of the first pad. In addition, in an interposer according to another embodiment, the first wire is formed using a damascene method and the second wire is formed with a semiadditive method.

In an interposer according to yet another embodiment, the L/S of the first wire is smaller than the L/S of the second wire. In addition, in an interposer according to still another embodiment, a surface including structures such as the first insulating layer, the first land, the second land and the first wire is flat. In addition, in an interposer according to still another embodiment, the diameter of the first land is greater than the diameter of the first via conductor. In addition, in an interposer according to another embodiment, the diameter of the first land is equal to the diameter of the first via conductor.

In an interposer according to another embodiment, a first protective film having an aperture on both the first pad and the second pad is further provided. In addition, in an interposer according to another embodiment, a second protective film having an aperture on the fourth pad is further provided.

In an interposer according to another embodiment, multiple first insulating layers are provided. In addition, in an interposer according to another embodiment, an inorganic film is provided between the first insulating layer and the second insulating layer.

A method for manufacturing an interposer according to an embodiment of the present invention includes a process to form a first insulating layer made of an inorganic material on a supporting substrate, a process to form a first wire in the first insulating layer, a process to form a second insulating layer on a first side of the first insulating layer, a process to form a second wire with a longer wire length and a greater thickness than the first wire on the second insulating layer, and a process to eliminate the supporting substrate.

According to the method for manufacturing an interposer, an interposer having the first wire to implement minute drawing and the second wire with lower wire resistance per unit length than the first wire can be manufactured. In such an interposer, with the wire between the first electronic component loaded on the second side of the first insulating layer and the second component loaded on the first side of the first insulating layer by implementing, for example, only minute drawing that is invariably required between connecting terminals the first electronic component with the first wire, and made up of most of the wiring between the first electronic component and the second component with the second wire, wire resistance can be effectively reduced. Furthermore, an interposer suitable for high-volume signal transmissions can be achieved.

According to the method for manufacturing an interposer, the wire layers formed in the interposer can be reduced, and moreover, because the supporting substrate is eliminated, an interposer with a thin thickness can be manufactured. Such an interposer may be an interposer with low mounting height when electronic components are loaded.

In a method for manufacturing an interposer according to an embodiment, the second wire is formed using a semiadditive method. By using the semiadditive method, the second wire with a longer wire length and a greater thickness (lower wire resistance per unit length) than the first wire can be formed simply and at low cost.

In a method for manufacturing an interposer according to an embodiment, the first wire is formed using a damascene method. By using the damascene method, the first wire to implement minute drawing can be formed precisely. Moreover, it is possible to form a wire with high flatness.

In a method for manufacturing an interposer according to an embodiment, an inorganic film is formed on a first side of the first insulating layer. By forming the inorganic film, adhesion between the first insulating layer and the second insulating layer can be improved when the insulating layer is formed on the inorganic film.

A method for manufacturing an interposer according to an embodiment further includes a process to form a third wire on the first insulating layer; a process to form a third insulating layer on a second side of the first insulating layer; and a process to form a fourth wire with a longer wire length and a greater thickness than the third wire on the third insulating layer.

According to the method for manufacturing an interposer, an interposer having the third wire to implement minute drawing and the fourth wire with lower wire resistance per unit length than the third wire can be manufactured. For such an interposer, a first electronic component and a third electronic component on a second side of a first insulating layer, as well as a second electronic component on a first side of the first insulating layer, can be loaded.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing an interposer comprising:
   forming a first insulating layer comprising an inorganic material on a supporting substrate;
   forming a first wire in the first insulating layer;
   forming a second insulating layer on a first side of the first insulating layer;
   forming a second wire with a longer wire length and a greater thickness than the first wire on the second insulating layer;
   removing the supporting substrate;
   forming a third wire in the first insulating layer;
   forming a third insulating layer on a second side of the first insulating layer; and
   forming a fourth wire with a longer wire length and a greater thickness than the third wire on the third insulating layer.

2. A method for manufacturing an interposer according to claim 1, wherein the forming of the second wire comprises forming the second wire by a semiadditive method.

3. A method for manufacturing an interposer according to claim 2, further comprising forming an inorganic film on the first side of the first insulating layer.

4. A method for manufacturing an interposer according to claim 1, wherein the forming of the first wire comprises forming the first wire by a damascene method.

5. A method for manufacturing an interposer according to claim 4, further comprising forming an inorganic film on the first side of the first insulating layer.

6. A method for manufacturing an interposer according to claim 1, further comprising forming an inorganic film on the first side of the first insulating layer.

7. A method for manufacturing an interposer according to claim 1, wherein the forming of the first wire comprises forming the first wire by a damascene method, and the forming of the second wire comprises forming the second wire by a semiadditive method.

8. A method for manufacturing an interposer according to claim 7, further comprising forming an inorganic film on the first side of the first insulating layer.

9. A method for manufacturing an interposer according to claim 1, wherein the forming of the third wire comprises forming the third wire by a damascene method.

10. A method for manufacturing an interposer according to claim 9, wherein the forming of the second wire comprises forming the second wire by a semiadditive method.

11. A method for manufacturing an interposer according to claim 9, wherein the forming of the first wire comprises forming the first wire by a damascene method.

12. A method for manufacturing an interposer according to claim 9, wherein the forming of the first wire comprises forming the first wire by a damascene method, and the forming of the second wire comprises forming the second wire by a semiadditive method.

13. A method for manufacturing an interposer according to claim 1, further comprising:
    forming a first land in the first insulating layer; and
    forming a second land in the first insulating layer,
    wherein the first wiring connects the first land and the second land.

14. A method for manufacturing an interposer according to claim 1, further comprising:
    forming a first land in the first insulating layer; and
    forming a second pad positioned to load an electronic component on the second insulating layer,
    wherein the first wiring and the second wiring connect the first land and the second pad.

15. A method for manufacturing an interposer according to claim 1, wherein the second wire has a lower wiring resistance per unit length than the first wire.

16. A method for manufacturing an interposer according to claim 1, wherein the second wire has a thickness of which a ratio relative to a thickness of the first wire is greater than 1 and 15 or less.

17. A method for manufacturing an interposer according to claim 1, wherein the second insulating layer comprises an organic material.

18. A method for manufacturing an interposer according to claim 1, wherein the first wire has a wire width/distance between adjacent wires (L/S) which is less than an L/S of the second wire.

19. A method for manufacturing an interposer according to claim 1, further comprising:
    forming a first land in the first insulating layer;
    forming a second land in the first insulating layer; and
    forming a second pad positioned to load an electronic component on the second insulating layer,
    wherein the first wiring connects the first land and the second land, and the second wiring connects the second land and the second pad.

20. A method for manufacturing an interposer according to claim 19, wherein the forming of the first wire comprises forming the first wire by a damascene method, the forming of the first land comprises forming the first land by a damascene method, the forming of the second land comprises forming the second land by a damascene method, the forming of the second wire comprises forming the second wire by a semiadditive method, and the forming of the second pad comprises forming the second pad by a semiadditive method.

* * * * *